(12) United States Patent
Shapiro et al.

(10) Patent No.: US 9,940,808 B2
(45) Date of Patent: *Apr. 10, 2018

(54) GEOLOCATION BRACELET, SYSTEM, AND METHODS

(71) Applicant: Fynd Technologies, Inc., Hollywood, FL (US)

(72) Inventors: Ryan J. Shapiro, Bay Harbor Islands, FL (US); Thomas Harrah, Parkland, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 15/451,368

(22) Filed: Mar. 6, 2017

(65) Prior Publication Data

US 2017/0178483 A1 Jun. 22, 2017

Related U.S. Application Data

(63) Continuation of application No. 14/950,352, filed on Nov. 24, 2015, now Pat. No. 9,654,917.

(Continued)

(51) Int. Cl.
*G08B 1/08* (2006.01)
*G08B 21/02* (2006.01)
(Continued)

(52) U.S. Cl.
CPC ..... *G08B 21/0266* (2013.01); *G08B 21/0288* (2013.01); *H02J 7/025* (2013.01); *H05K 1/0278* (2013.01); *H05K 5/0086* (2013.01)

(58) Field of Classification Search
CPC .............................. H04W 4/02; H05K 1/0278
See application file for complete search history.

(56) References Cited

U.S. PATENT DOCUMENTS 7,751,832 B2  7/2010  Bartkowski
7,828,697 B1  11/2010  Oberrieder et al.
(Continued)

FOREIGN PATENT DOCUMENTS

GB  2505981 A  3/2014
WO  2009063094 A2  5/2009
(Continued)

OTHER PUBLICATIONS

PCT International Search Report and Written Opinion PCT/US15/62311, international filing date of Nov. 24, 2015, dated Feb. 1, 2016.

*Primary Examiner* — Erin M File
(74) *Attorney, Agent, or Firm* — Acuity Law Group, P.C.; Daniel M. Chambers

(57) ABSTRACT

An identity, position, and/or health monitoring apparatus is provided. The identity, position, and/or health monitoring apparatus includes a retention feature, such as a wristband, configured to removably secure the monitoring apparatus to a person, such as a child. Particularly, the band of the monitoring apparatus may be a flexible and/or stretchable band that may be worn around a part of the body, such as a wrist or ankle. The band may be defoned by a circumferential member and/or may include first and second ends and a clasping mechanism configured to clasp and secure the first and second ends together, such as around the wrist or ankle of the user. In certain instances, the monitoring apparatus is retained within the band, and in other instances, the monitoring apparatus may be removable from the band, and the clasping mechanism may be configured for allowing the monitoring device to be removably attached therewith.

20 Claims, 7 Drawing Sheets

Related U.S. Application Data

(60) Provisional application No. 62/084,433, filed on Nov. 25, 2014.

(51) Int. Cl.
*H05K 1/02* (2006.01)
*H02J 7/02* (2016.01)
*H05K 5/00* (2006.01)

(56) References Cited

U.S. PATENT DOCUMENTS

| | | | |
|---|---|---|---|
| 9,257,740 B2 | 2/2016 | Lyons et al. | |
| 9,274,562 B2 | 3/2016 | Franklin et al. | |
| 2001/0052849 A1 | 12/2001 | Jones | |
| 2008/0271772 A1* | 11/2008 | Leonov | G01J 5/12 136/205 |
| 2009/0231960 A1 | 9/2009 | Hutcheson | |
| 2009/0306485 A1* | 12/2009 | Bell | A61B 5/04085 600/301 |
| 2011/0003665 A1* | 1/2011 | Burton | G04F 10/00 482/9 |
| 2011/0248853 A1 | 10/2011 | Roper et al. | |
| 2012/0007735 A1 | 1/2012 | Rhyins | |
| 2012/0015778 A1* | 1/2012 | Lee | A63B 71/0622 482/8 |
| 2012/0249797 A1 | 10/2012 | Haddick et al. | |
| 2012/0330109 A1 | 12/2012 | Tran | |
| 2013/0087593 A1* | 4/2013 | Ivarez | H04B 1/3838 224/576 |
| 2013/0127980 A1 | 5/2013 | Haddick et al. | |
| 2013/0144411 A1* | 6/2013 | Savarese | G06F 17/40 700/91 |
| 2013/0322646 A1* | 12/2013 | Davie | H04R 1/1041 381/74 |
| 2013/0326790 A1* | 12/2013 | Cauwels | A44C 5/2071 2/170 |
| 2014/0002239 A1 | 1/2014 | Rayner | |
| 2014/0135631 A1* | 5/2014 | Brumback | A61B 5/02438 600/479 |
| 2014/0226444 A1 | 8/2014 | Otazo | |
| 2014/0343700 A1* | 11/2014 | Soohoo | G06K 9/00342 700/91 |
| 2014/0361147 A1* | 12/2014 | Fei | G01J 1/0407 250/206 |
| 2014/0378853 A1* | 12/2014 | McKinney | A61B 5/02438 600/509 |
| 2015/0084769 A1 | 3/2015 | Messier et al. | |
| 2015/0120881 A1 | 4/2015 | Manchado | |
| 2015/0186533 A1* | 7/2015 | Patil | G06F 17/30867 707/723 |
| 2015/0230761 A1* | 8/2015 | Brumback | A61B 5/7475 600/479 |
| 2015/0241917 A1 | 8/2015 | Seok et al. | |
| 2015/0272458 A1* | 10/2015 | Magniez | A61B 5/02438 600/479 |
| 2015/0282713 A1* | 10/2015 | Fei | A61B 5/0059 600/476 |
| 2016/0020506 A1 | 1/2016 | Mahanfar et al. | |
| 2016/0021535 A1* | 1/2016 | Tali | H04W 68/00 455/411 |
| 2016/0105557 A1* | 4/2016 | van der Raadt | H04M 3/44 455/564 |
| 2016/0124396 A1 | 5/2016 | Choi et al. | |
| 2016/0127900 A1* | 5/2016 | Archibald | H04W 12/06 726/7 |
| 2016/0150362 A1* | 5/2016 | Shaprio | H05K 1/0278 340/539.13 |
| 2016/0157168 A1 | 6/2016 | Xue et al. | |
| 2016/0182826 A1* | 6/2016 | Blum | H04N 5/23241 348/372 |
| 2016/0227361 A1 | 8/2016 | Booth et al. | |

FOREIGN PATENT DOCUMENTS

| | | |
|---|---|---|
| WO | 2013159217 A1 | 10/2013 |
| WO | 2015019360 A1 | 2/2015 |
| WO | 2016085920 A1 | 6/2016 |
| WO | 2016124599 A1 | 8/2016 |
| WO | 2016203182 A1 | 12/2016 |

* cited by examiner

GEOLOCATION BRACELET, SYSTEM, AND METHODS

FIELD OF THE DISCLOSURE

An identity, geolocation (e.g., position), and/or health status monitoring apparatus that has a thin profile, is low cost, and is curved.

BACKGROUND TO THE DISCLOSURE

The monitoring of children is an important aspect of keeping them safe. Parents of newborns often monitor their infants while sleeping by means of an electronic monitoring system. This system typically includes a pair of radio units often including one or more of a transmitter and/or a receiver. The first radio unit includes a transmitter that is placed in the room of the sleeping newborn so as to listen to the infant's sleeping and breathing. If, in any given instance, the child starts crying or evidences a problem in breathing, the transmitter can pick up the sounds of the child and transmit them to its companion unit containing a receiver, whereby upon receipt of the radio transmission of the sounds, the parent or other monitoring person, can be alerted to come and check on the child.

In other instances, the parents of a child may monitor that child and/or the child's caretaker by placing a video monitoring device in the room of the child, which monitoring device may be configured to keep a video record of the child within the room and/or transmit the same, such as over an internal WI-FI network, such as to an auxiliary receiving unit, so as to allow the parent to monitor the child within the room. In further instances, the parent may keep track of the child by tracking the child's possession of a mobile telephonic device. For instance, in various instances, a mobile device, such as in the possession of a child, may be triangulated by the respective cell towers it comes into range with, and the position of the cell phone can be transmitted, such as over the cellular network, to a third party monitor, such as a parent.

However, although there are many benefits in using various of the devices set forth above, such as for the monitoring, tracking, and/or protecting of children, each of these devices may have some drawbacks. For instance, while baby monitors are useful for monitoring an infant while it is sleeping, and video cameras may be useful for monitoring the room of a child, they are limited in usefulness in that they are limited to monitoring sounds and images and not tracking movement of the child, such as while outside of the home. The mobile monitoring system provided by various tracking software installed on a person's mobile telephone, as discussed above, is useful in tracking the movement of the respective phone. However, although useful, such a monitoring and tracking system also suffers from some drawbacks in that such monitoring systems rely on the mobile device being tracked and are, therefore, dependent on the battery life of the phones. Since, phones are used for several different purposes, besides tracking and monitoring the whereabouts of the phone, this battery life does not last long, making the use of the phone as a tracking device less than ideal.

What is needed therefore is a device, system, and method of using the same that is configured for identifying, locating, and/or monitoring one or more conditions of a user. It would additionally be beneficial if such a device were also inexpensive, easy to manufacture, mobile, and had a long lasting battery life. The devices, systems, and methods of their use as described herein meet these and other such needs.

SUMMARY OF THE DISCLOSURE

In one aspect, provided herein is a thin profile geolocation device for locating an object within a geographical region that is easy to use and simple to manufacture. In various instances, the device may be configured to function as an identity, position, and/or health status monitoring apparatus. The geolocation, identity, position, and/or health monitoring devices and systems provided herein may be configured as a small chip that is attachable or otherwise capable of being mounted to a substrate, for easy transport, and/or may be configured to be coupled with or otherwise made part of a secondary article, such as a bracelet, so as to be capable of being worn. In various instances, the chip has a thin profile, is lightweight, uses low energy, and may be curved, such as for ease of use, such as within the bounds of a curved piece of jewelry, such as a bracelet, for instance, a sports band. For example, in one particular implementation, the geolocation device may be a chip that is capable of being coupled to or otherwise carried within a band, such as a sports band, and may be used to track the whereabouts of the wearer, which may be especially useful where the wearer is a child, such as a child prone to wandering off or in an environment that renders the child susceptible to abduction.

Accordingly, in one aspect, a substrate having electronic circuitry printed thereon is provided. For instance, in various implementations the substrate may be a circuit board and the electronic circuitry may be configured to function as a central processing unit (CPU). For example, in particular embodiments, the printed substrate may include a microchip having a CPU thereon, such as a CPU that is capable of performing various processing functions. In various embodiments, the printed circuit board (PCB) may be made of a rigid, semi-rigid, semi-flexible, flexible material or a combination of the same. Particularly, in certain instances, the substrate may have an elongated body that is defined by a proximal portion, which includes a proximal end, a distal portion, which includes a distal end, and a medial portion separating the proximal portion from the distal portion. In such an instance, the proximal, medial, and distal portions may be circumscribed by a circumferential portion. In other instances, the elongated body may simply be defined by the circumferential portion that bounds the first surface and the second surface of the elongated body. In such an instance, the elongated body may not need or include a first and/or second end portions, e.g., proximal and/or distal ends. In some instances, the first and second surfaces may be opposed to one another and form a waterproof encasing cavity therewith, the elongated body being sized and configured to be worn around a limb of a human, such as the wrist or ankle of a child. Accordingly, in certain instances, the PCB may be a combination of rigid and flexible materials so as to allow the components to be securely mounted on the rigid sections, while allowing the flexible sections to flex so that the overall board may be able to bend, and/or otherwise twist, stretch, or to curve such as to bend and/or conform to the wrists of a wearer of the band, such as a small child.

Particularly, the substrate may be composed of one or more layers, such as conductive layers, e.g., of metal portions such as copper, that have been layered on top of an insulating layer, such as an insulating layer made of a glass epoxy. In addition to including electronic circuitry, the printed substrate, e.g., a microchip having a microprocessor thereon, may additionally include or otherwise be operationally coupled with one or more other modules, such as a memory, a communications module, an input/output module, and an energy source, such as a low energy power source and/or battery. In certain embodiments, the microchip may include an onboard memory and/or communications module, and may be operably coupled to one or more sensors and/or one or more displays.

For instance, in various instances, a substrate is provided wherein the substrate may be a circuit board or otherwise include one or more of a microprocessor, a memory, a communications module, and an energy source, such as a low energy power source, e.g., a battery, powering the same. In certain instances, the substrate may include an input/output module, a sensing mechanism, and/or may be coupled to a display. In particular embodiments, the microchip may be any suitable processing unit, such as an Intel® or Arm® core processing unit. The memory may be any suitable memory such as NAND flash or FRAM. The communications module may include one or both of a suitable transmitter and/or a suitable receiver. For example, a typical transmitter may be a radio frequency (RF) transmitter, a cellular transmitter, WIFI, and/or a Bluetooth®, such as a low energy Bluetooth® transmitter unit. In some instances, a typical receiver may include a satellite based geolocation system or other mechanism for determining the position of an object in three-dimensional space. For instance, the geolocation system may include one or more technologies such as a Global Navigation Satellite System (GNSS). Exemplary GNSS systems that enable accurate geolocation can include GPS in the United States, Globalnaya navigatsionnaya sputnikovaya sistema (GLONASS) in Russia, Galileo in the European Union, and/or BeiDou System (BDS) in China.

The energy source may be any suitable source of energy such as a battery, such as Lithium Cadmium or Zink Manganese battery or wireless charging, solar, thermal, or motion re-chargeable battery. For instance, in various instances, the device, e.g., bracelet, may include a battery, which battery may be configured for being wirelessly charged. Particularly, the bracelet may be configured for being charged via induction and/or in accordance with a wireless charging standard, such as A4WP, Qi, and the like. For example, the bracelet may include a wireless power receiver that is adapted for receiving a charge over a distance from a power transmitter. In such an instance, the transmitter and receiver may include magnetic coils and/or antennas that are tuned together so as to transmit and receive an electrical and/or magnetic field that induces a current that may be used to charge an associated battery.

More particularly, the bracelet may be configured for being coupled to a power transmitter that is adapted for receiving a voltage and converting the received voltage into a high frequency alternating current that may be transmitted via a suitably configured transmitter circuit that is coupled to the transmitter coil. Such alternating current flowing through the transmitter coil generate a magnetic field that is received by the receiver coil of the bracelet, thereby generating a corresponding current within the receiver coil that may then be converted into direct current via a suitable transformer and stored as energy within the battery, thereby recharging the battery of the device. In various instances, the coils may be configured to resonate and/or oscillate in response to one another, e.g., at the same or similar frequency, such as through magnetic resonance whereby wireless charging over longer distances may be achieved.

In particular instances the circuit board containing the microprocessor, which may be configured so as to be worn by a user, such as a child whose location is to be monitored and/or tracked, may include and/or may otherwise be coupled to an input/output module, one or more displays, and/or one or more sensors. Input, such as input from a user, or a person associated with the user, may be received in any form, including, but not limited to, acoustic, speech, or tactile input. Accordingly, a typical input device may include, but is not limited to, keyboards, touch screens or other touch-sensitive devices such as single or multi-point resistive or capacitive trackpads, voice recognition hardware and software, optical scanners, optical pointers, digital image capture devices and associated interpretation software, a Universal Serial Bus (USB) port, Secure Digital Input Output (SD/SDIO) port, flash drive port, lightning port, and the like. A typical output device may be a display such as a capacitive sensing control panel display. In various instances, the display may be the typical display of a mobile computing device, such as the display of a mobile phone and/or tablet computer, and the like.

A typical sensor may be any form of data collection mechanism capable of detecting a relevant characteristic and configured for transmitting that data to the microprocessor for processing and/or transmission and/or display such as to the user or other third party, for instance, a parent, guardian, or medical personnel charged with taking care of the wearer of the circuit board. For instance, in certain instances, the sensor may be a motion and/or orientation sensor, such as a distance measuring sensor, such as a pedometer, a speed or velocity sensor, including an accelerometer, for example, a multi-axis accelerometer, a gyroscope, strain gauges, and/or a piezoelectric sensor, optical sensor, energy sensor, and the like. In various instances, the sensor may be configured so as to be a physiological data collector that may be configured to collect physiological data, such as data associated with a person, e.g., child or adult, and/or his or her state of health and/or performance in an activity, such as an activity requiring mental or physical exertion. For example, the sensor may be a physiologic sensor and/or data collector, such as a temperature gauge or body or environmental thermometer, so as to measure the temperature of the user and/or his environment; a heart rate monitor or pulse meter, so as to measure the heart rate of the user; a blood pressure monitor, to measure the users blood pressure; a blood glucose monitor, to measure blood glucose of the user; a myoelectric sensor; a carbon dioxide (CO2) sensor; a breathing rate monitor; a pulse oximeter; oxygen saturation monitors; hemoglobin sensors; an electrocardiogram; an electroencephalography monitor; and/or a pressure monitor; and the like.

In various instances, one or more thermal sensors may be included. For instance, a thermal sensor may include a thermocouple, an infra-red (IR) thermal sensor, and/or other temperature sensing technology. Additionally, in various embodiments, sensors capable of determining one or more characteristics regarding the physical environment may be included, for example, sensors that detect changes in the immediate environment may include temperature sensors, altimeters, wind sensors, humidity sensors, and the like. In various instances, this environmental data can be integrated with one or more of the above referenced physiological data for a determination as to where geographically the sensor is and/or what the condition is of the user of the sensor. In various instances, the information captured, compiled, and/or processed by the one or more sensors set forth above may be communicated to the user, such as in a visual, auditory, or tactile manner, such as via a display, a graphic, a light, e.g., an LED light, light sequence, or series of light, such as from green to yellow to red, a sounded alarm or bell, or a vibration, and the like.

These signals may also be arranged to increase or decrease in intensity and/or frequency dependent on the results of the collected and/or compiled data. For example, the amplitude, timing, and duration of an auditory, visual, and/or tactile signal can be varied to indicate to a user or a monitor of the user the nature of the changed input. Particularly, a monitoring and/or tracking device of the disclosure can indicate, e.g., vibrate, in response to a data signal from a sensor, relay, beacon, or other device of the system when a user enters or leaves a certain range of a target distance, target location, target time, physiologic characteristic (e.g., heart rate for a specified time period, breath rate, or number of footfalls, etc.), and the like, or combination thereof. Hence, the tracking device, as well as the location and/or status monitoring device can be configured to vibrate to alert the monitoring entity that the tracking device is going and/or has gone out of range from the target distance, target location, target time, physiologic characteristic (e.g., heart rate for a specified time period, breath rate, or number of footfalls, etc.), and the like, or combination thereof.

Accordingly, in one aspect, a wearable thin profile waterproof geolocation device such as for locating an object, e.g., a child, within a geographical region. In such instances, the geolocation device may include a substrate having an elongated body that is defined by a circumferential portion. The circumferential portion may have two ends, e.g., a first proximal end and a second distal end, which are configured for being joined together, or the circumferential portion may be of a single molded piece having a first surface and a second surface that have been coupled together, e.g., by molding. Hence, in particular instances, the substrate may include a circumferential portion that bounds a first surface and a second surface of the elongated body, such as where the first surface is opposite the second surface and forms a cavity therewith, e.g., a waterproof cavity. In some instances, the elongated body may be sized and configured to be worn around a limb of a human, such as an arm, ankle, or neck of a child.

The substrate may be configured to house a semi-flexible digital logic circuit board arrangement, which may be contained within the cavity of the elongated body of the substrate. In such an instance, the semi-flexible digital logic circuit board arrangement may include a plurality of rigid circuit board portions connected by one or more flexible portions, such as where the digital logic circuit board arrangement is positioned between the first and second surfaces of the elongated body of the substrate. In particular instances, one or more of the rigid circuit board portions of the digital logic circuit board arrangement may include one or more of a central processing unit (CPU), a communications module, a memory, and a battery, such as where the CPU is operably connected to one or both the memory and the battery.

In some instances, the digital logic circuit board arrangement may further include a pairing device such as for pairing the geolocation device with a remote master device, e.g., via a wireless communication channel. In such an instance, the pairing may be defined by a distance between the geolocation device and the master device such that if the distance between the geolocation device and the master device exceeds a predetermined range, an alarm is set off in one or more of the geolocation device and the master device.

In another aspect, a system for determining and/or displaying information about a user, his or her position and/or location, and/or a state of his or her condition of health is provided. In certain instances, the system may also be configured for transmitting the data to a third party, such as a third party interested in identifying, monitoring, and/or tracking the user and/or the user's activities and/or health. For instance, in various embodiments, the system may include one or more of a geolocation device, such as that described above, a network, a data processing unit, one or more external sensors, e.g., a beacon or relay, and/or a receiver, such as a computing device, e.g., a mobile computing device and/or other viewing system.

For example, the system may provide a geolocation device, such as that described above, which geolocation device may include one or more of a microprocessor, a memory, a communications module, an input/output port, and/or a sensor. In such an instance, the geolocation device may be contained within a housing, such as within the bounds of a bracelet, ring, keychain, or the like, which may be worn, such as by a child, adult, or other animal or object the tracking of which may be desired, such as by a parent wanting to ensure the safety of the child. In particular, the geolocation device may function in part to display the identity of the user and/or a condition of the users health. As indicated, in various instances, the device may contain a communications module that not only includes a receiver, such as a GPS receiver, such as for determining the location of the device, but also includes a transmitter, such as for transmitting such position and other data to the receiving device.

Consequently, the system may be configured to track and/or monitor the user and/or the condition of the user. Hence, in such instances the system may include a receiver, such as a computing device that is suitably configured for receiving a transmission, for instance, a signal, such as a digital signal, from the transmitter of the geolocation device. Additionally, the system may include a network, such as a cellular, WIFI, or other network interface that is configured for effectuating the transfer of data from the transmitter of the geolocation device to the receiver of the computing device. In various instances the system may include a data processing system, for processing the data prior to or after transmission. Further, in some instances, the system may include a viewing system, such as a display screen, for instance, a liquid crystal display (LCD), light emitting diode (LED) display, plasma display, or the like.

In another aspect, a method for monitoring and/or tracking a person or an object is provided. The method may include one or more of providing a geolocating device, such as that set forth above, attaching the geolocating device to a person or an object to be monitored and/or tracked, and employing a receiver to monitor and/or track the person or object, such as over a network joining the two. More particularly, the method may include providing the geolocating device and employing the system described above to monitor and/or track the person or object. In various instances, the system may include a relay, such as a beacon, that is configured to receive a signal from the geolocating device so as to thereby determine the location of the device, and further transferring that information, such as via the network, to the receiver so as to thereby allow a third party to monitor the position and other data collected by the device.

DETAILED DESCRIPTION OF THE DISCLOSURE

Figure 1A:
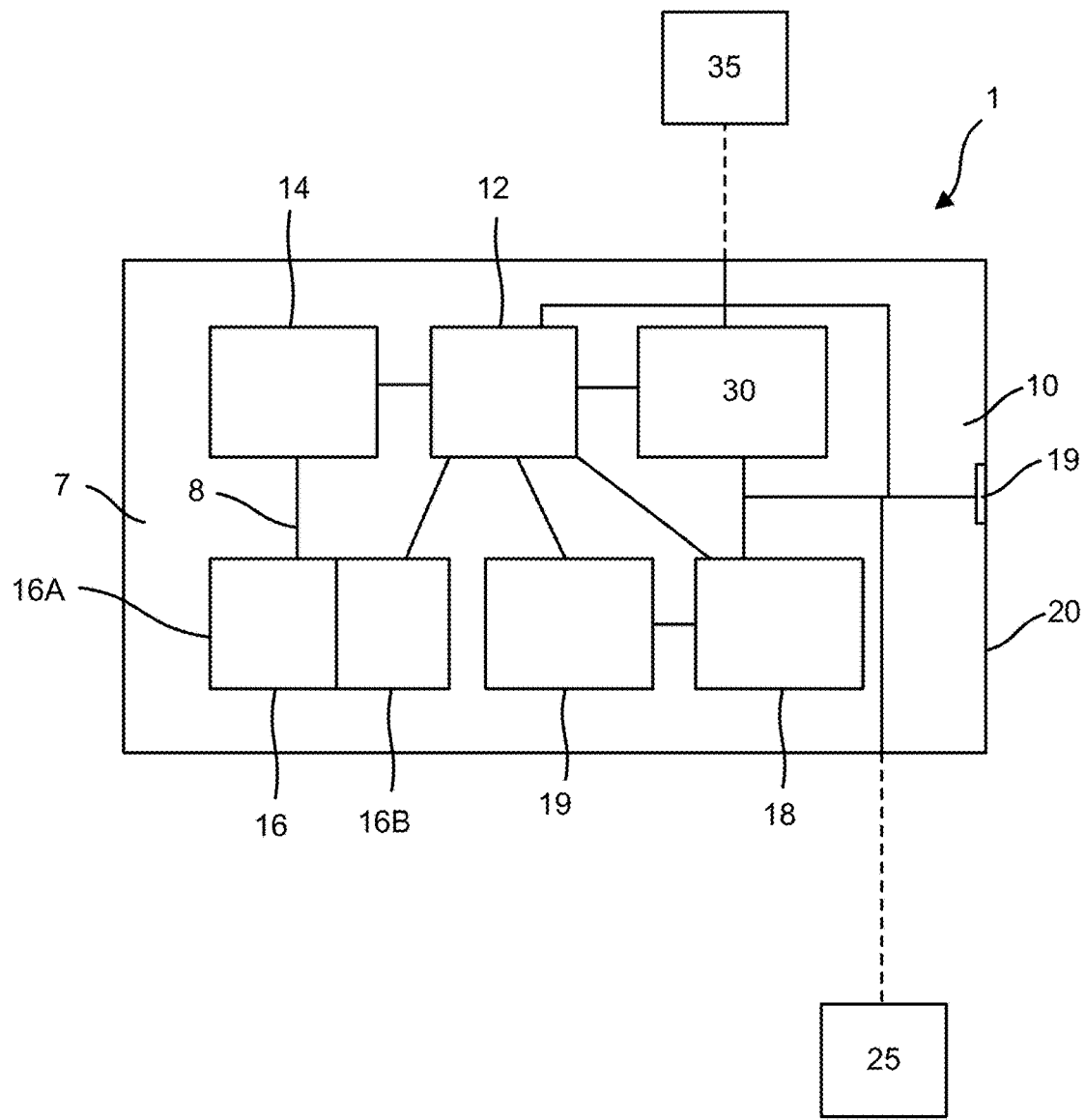
FIG. 1A is a diagram of an exemplary system including an identity, geolocation, and/or health status monitoring apparatus of the disclosure.

As summarized above, provided herein is an identity, position, and/or health monitoring apparatus that is simple to use and easy to manufacture. In various embodiments, the identity, position, and/or health monitoring apparatus may be contained within a housing, which housing may include a retention feature, such as wristband, collar, keychain, or the like, configured to removably secure the monitoring apparatus to a person, animal, or object, such as a child. For instance, in particular embodiments, the monitoring apparatus may include a band, such as a flexible and/or stretchable band that may be worn around a part of the body, such as a neck, wrist, or ankle. The band may be made of one piece, continuously joined end to end, so as to form a complete unitary unit that deforms in some manner during the attachment process and reforms once attached for ease of wearing. Alternatively, the band may include first and second ends that are joinable via a clasping mechanism configured to clasp and secure the first and second ends together, such as around the neck, wrist, or ankle of the user. In certain instances, the monitoring apparatus is retained within the band, such as between first and second surfaces of the band; and in other instances, the monitoring apparatus may be removable from the band, in various manners, and the clasping mechanism may be configured for allowing the monitoring device to be removably attached therewith.

The identity, position, and/or health monitoring apparatuses, systems, and their methods of use provided herein below with reference to the appended figures are configurable and capable of one or more of identifying information about the user, or a condition of the user, the position or location of the user, and/or for monitoring a physiological condition of the user and/or his or her environment. Accordingly, in some instances, the identity, position, and/or health monitoring apparatus simply functions as an electronic identifier of the person wearing the apparatus. In other instances, the monitoring apparatus functions to simply monitor the position of the wearer of the apparatus, such as in relation to a second or third party monitoring device(s). For instance, where the wearer is a child, the monitoring apparatus may be formed so as to be worn around the wrist or ankle of the child, and may be configured for communicating with a monitoring device, e.g., a mobile computing device, such as of the parent or guardian of the child, for example, to keep track of the child's position in relation to that of the parent or guardian. In further instances, the monitoring apparatus may simply function to identify a record, such as a record of a medical condition, such as an allergy to a medication, an alert as to having diabetes or glycaemia, or other such disease, and the like; and in some instances monitoring device may function to monitor and/or collect physiological data of the wearer.

For example, in some embodiments, the identity, position, and/or health monitoring apparatus may include a physiological and/or environmental data collector, such as a sensor, which may be configured to collect physiological data associated with the child, his or her environment, and/or their performance level in an activity, such as an activity requiring mental or physical exertion. In such an instance, the monitoring apparatus may include electronic circuitry that is configured to receive physiological and/or environmental data associated with the child and/or the child's environment, and in some instances, may further be configured for processing that physiological and/or environmental data, and/or wirelessly transmitting the physiological and/or environmental data to a secondary or tertiary monitoring device, such as a mobile electronic device of a second party, such as a parent of the child, or a third party, such as a health care monitor, for display thereby, such as on the mobile electronic device of the parent or desktop computer of the healthcare professional. In various embodiments, the monitoring apparatus may be configured for performing a combination or even all of: functioning as an electronic identifier, a position detector, and/or a physiological condition monitor.

Accordingly, as can be seen with respect to FIG. 1A, in one aspect, an identity, position, and/or health monitoring apparatus 1 is provided. With reference to FIG. 1A, the apparatus includes a substrate 7 upon which electronic circuitry 8 has been printed, so as to form a printed circuit board 10. In particular embodiments, the electronic circuitry 8 is configured so as to form a central processing unit 12. The circuit board may include additional components such as a memory 14 and a communications module 16 that are operably coupled to the central processing unit 12, all of which may be powered by an onboard power source 18, such as a battery. In some instances, the circuit board 10 may include an input/output (I/O) 19 device operably coupled therewith. Together the circuit board 10 containing the central processing unit 12, the communications module 16, battery 18 and/or the memory 14 and/or I/O 19 may be configured as a chip 20 that is attachable or otherwise capable of being mounted to a housing 40, for easy transport, and/or may be configured to be coupled with or otherwise made part of a secondary article 50, such as a bracelet, so as to be capable of being worn by a user 100.

For instance, in one particular implementation, the geolocation device 1 may be a chip 20 that is capable of being coupled to or otherwise carried by or within a band, such as a sports band capable of being worn, and may be used to track the whereabouts of the wearer, which may be especially useful where the wearer is a child, such as a child prone to wandering off or in an environment that renders the child susceptible to abduction. Accordingly, in one aspect, the chip 20 may simply include a substrate 7 having electronic circuitry 8 printed thereon, which electronic circuitry functions to collect and process information about the child, the child's location, his or her condition, and/or the environment that they are in. In various implementations, the substrate 7 may be a circuit board 10 and the electronic circuitry 8 may be configured to function as a central processing unit (CPU) 12.

In particular embodiments, the electronic circuitry 8 may be configured so as to from a CPU 12, which CPU 12 may comprise a microprocessor. The microprocessor 12 may be coupled to the substrate 7 to from at least part of circuit board 10. In various embodiments, the microprocessor 12 may be a microchip, which microchip 12 is capable of being coupled to the circuit board 10 and is configured for performing various processing functions related to identifying, locating, and/or sensing a condition of a user 100 to which the chip 20 is coupled. Additionally, in various instances, the microprocessor 12 may be configured so as to include an onboard memory, communications module, and/or an input/output for communicating with the circuit board 10. Hence, in certain embodiments, the identity, position, and/or health monitoring apparatus 1 is configured for communicating the same to a third party, such as over an associated network.

Accordingly, in various embodiments, in addition to including the microchip 12 having a microprocessor therein, the circuit board 10, and/or microchip itself, may additionally include or otherwise be operationally coupled with one or more other modules, such as a memory 14, a communications module 16, an input/output module 19, all of which may be powered by a power source 18. Additionally, in certain embodiments, the circuit board 10 may be configured as a small chip 20 that may be operably coupled to one or more sensors 30 and/or one or more displays 25. More particularly, in various instances, a substrate 7 is provided wherein the substrate may be a circuit board 10 or otherwise include one or more of a microprocessor 12, a memory 14, a communications module 16, and an energy source 18, e.g., a battery, powering the same. In certain instances, the circuit board 10 may include an input/output module 19, a sensing mechanism 35 being operably connected to a sensory control unit 30 and/or the microprocessor 12, and/or may be coupled to a display 25.

In particular embodiments, the microchip 12 may be any suitable processing unit, such as an Intel® or Arm® core processing unit and/or microprocessor. The memory 14 may be any suitable memory such as a RAM, ROM, NAND flash or FRAM. The communications module 16 may include one or both of a suitable transmitter 16A and/or a suitable receiver 16B. For example, a typical transmitter 16A may be a radio frequency (RF) transmitter, a cellular transmitter, WIFI, and/or a Bluetooth®, such as a low energy Bluetooth® transmitter unit. In some instances, a typical receiver 16B may include a satellite based geolocation system or other mechanism for determining the position of an object in three-dimensional space. For instance, the geolocation system may include one or more technologies such as a Global Navigation Satellite System (GNSS). Exemplary GNSS systems that enable accurate geolocation can include GPS in the United States, Globalnaya navigatsionnaya sputnikovaya sistema (GLONASS) in Russia, Galileo in the European Union, and/or BeiDou System (BDS) in China.

Figure 1B:
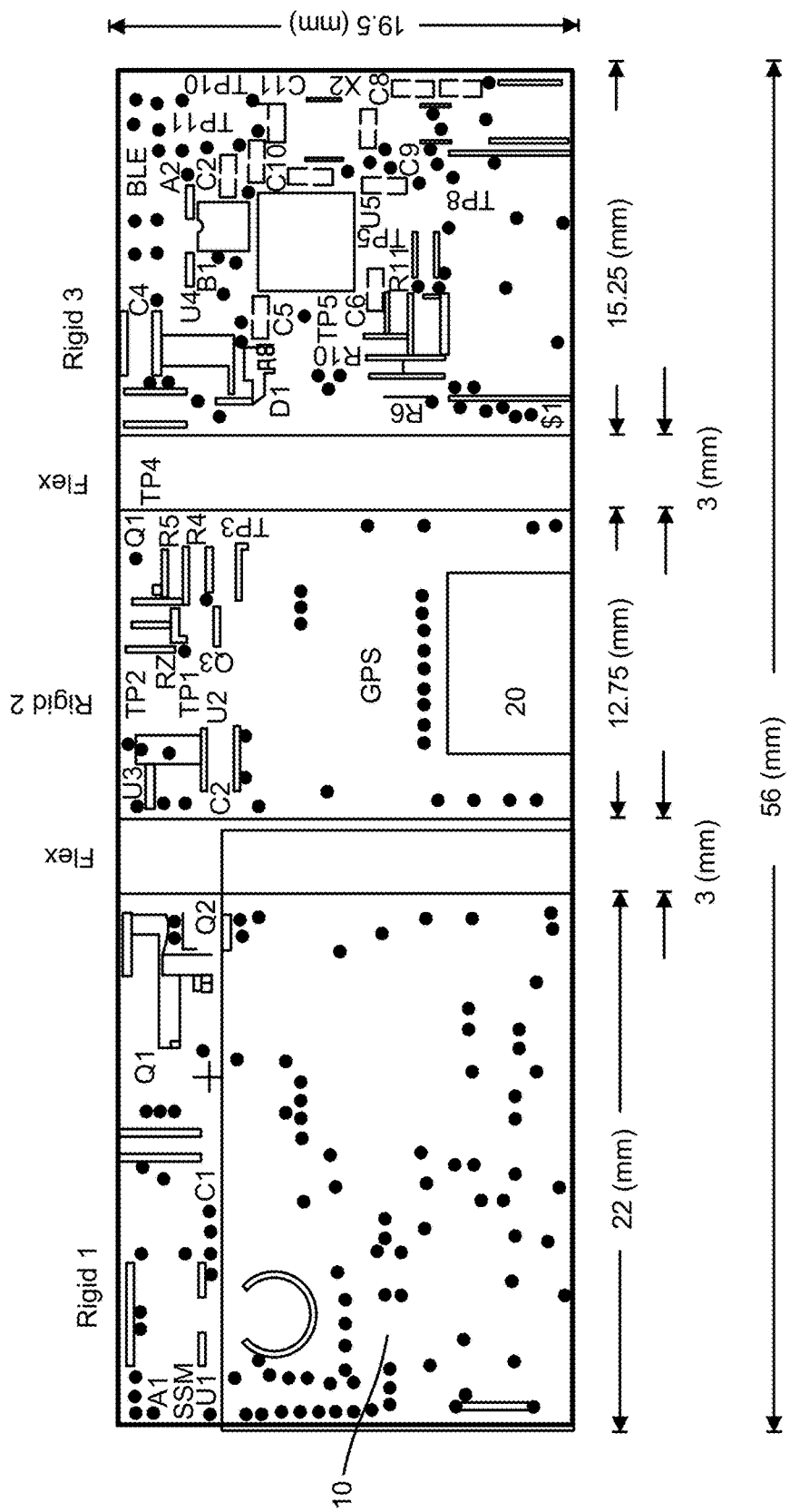
FIG. 1B is view of an exemplary flexible identity, geolocation, and/or health status monitoring apparatus, configured to be encased within the bounds of an auxiliary retaining device, such as a bracelet.
Figure 1C:
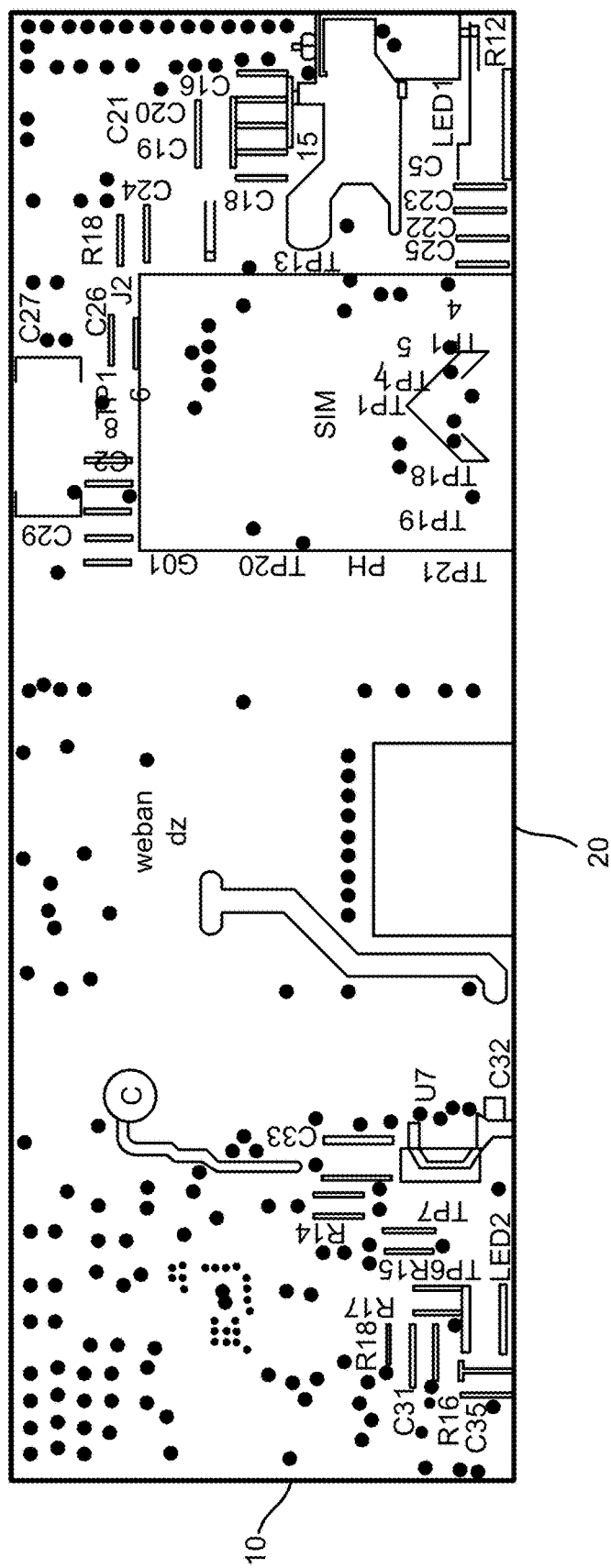
FIG. 1C is a view of another exemplary rigid or semi-rigid, identity, geolocation, and/or health status monitoring apparatus of the disclosure.

In various instances, as seen in FIG. 1B, the microchip 20 may part of a circuit board 10, such as a flexible or semi-flexible digital logic circuit board. The circuit board 10 may be a printed circuit board that includes the various components of the system 1. As described above these components may include one or more of a microchip 20, a memory 14, a communications module 16, an input/output module 19, a power source 18, and the like. One or more of these components may be operably connected to one another such as by one or more inter connects, such as flexibly printed interconnects. Additionally, in certain embodiments, the circuit board 10 may include one or more I/Os 19 and/or may be electronically coupled to one or more sensors 30. In particular instances, the circuit board 10 may be rigid or semi-rigid and may include or otherwise be coupled to a GPS module, as shown in FIG. 1B, and/or a SIM card and/or chip set, as shown in FIG. 1C.

Accordingly, in particular instances, a geolocation device of the disclosure may include an elongated substrate forming a flexible or semi-flexible digital logic circuit board arrangement, which circuit board may be contained within a cavity of an elongated body of the substrate or a first and/or second surface of an encasement housing the substrate, e.g., within a cavity thereof. In such an instance, the semi-flexible digital logic circuit board arrangement may include a plurality of rigid circuit board portions that may be connected by one or more flexible portions, such as where the digital logic circuit board arrangement is positioned between the first and second surfaces of the elongated body of the substrate. In some instances, the one or more of the rigid circuit board portions of the digital logic circuit board arrangement may include a central processing unit (CPU), a communications module, a memory, and an energy source, e.g., a battery, such as where the CPU is operably connected to both the memory and the battery.

The energy source 18 may be any suitable source of energy such as a battery, such as a wireless charger, solar, thermal, motion, or other renewable energy source and/or rechargeable battery, such as a battery having a long energy life. For instance, a long battery life may be achieved through a combination of functions of components, such as through the use of Bluetooth Low Energy (BLE) RF technology. For example, the chip, chipset, and/or bracelet having a suitably configured transmitter and/or receiver, e.g., GPS, may be configured for being paired, such as in a master/servant relationship with another device such as a mobile phone device, such as with the smart-phone of a parent and/or guardian.

In such an instance, when the wearer of the device, e.g., the child, is within a selected range, e.g., within 5, 10, 15, 20, 25, 30, 40, 50, 60, 70, 75, or even 100 feet (meters or yards) from the connected device, the higher energy consuming functions, such as the GPS function, may be turned off, e.g., manually or automatically, and hence energy will be conserved because the higher energy functions, e.g., GPS and/or cellular communication functions, are not being employed. Particularly, in some instances, a typical power draw of the device while paired with a smartphone, tablet, or other BLE device may be less than 1000 uW, less than 500 uW, less than 250 uW, less than 150 uW, less than 100 uW, less than 75 uW, less than 50 uW, less than 25 uW, less than 15 uW, or even less than 10 uW. More particularly, the energy saving dynamics as herein described may be such that when paired with a BLE device, the device, e.g., bracelet, may run for over 1 or 2 years on a simple coin cell battery (e.g., a typical 2032 coin battery holds 600+mWH of power, 600 mW/50 uW=600/0.05=12000 hours=500 days). Further, when the device is operated in the BLE mode exclusively, then the battery life may be up to about 3, 4, or 5 years, dependent on the configuration. Accordingly, given these results, the device may be configured to optimize its functionality with respect to prolonged and/or enhanced operation in the BLE connection mode.

However, when the geolocation device, e.g., bracelet loses connectivity with the master, e.g., parent's device, it may automatically switch to cellular communications mode, or may not immediately switch to cellular communication. For instance, in certain instances, it may first attempt to connect to any other previously paired device, such as switching from one parent's phone to another, of from one relative to another, or from one safe location beacon to another. If such a connection is not established, it may also try again to contact with a previously paired, safe device, such as the Dad's phone. This allows for any momentary RF disruptions to be handled without substantially impacting the battery life of the device. For example, in some instances, only when a carefully selected amount of time with no connection and/or communication has passed will the device, e.g., bracelet, power up the GPS and/or cellular communication hardware. Further, the device may be configured such that at all times while not in a BLE connection, the bracelet may periodically and/or continually attempt to re-establish a BLE connection, which operation may be configured to take extremely little power.

For instance, in certain instances, the geolocation and/or status monitoring device, e.g., bracelet, may be configured for communicating with a controlling device, e.g., a master device, and possibly one or more other geolocation and status monitoring devices, or third party device, e.g., computer, such as to alert a user, parent, or third party monitor to the location of the geolocation device and status monitoring device. Such controlling devices can be standalone, dedicated devices such as devices that may be solely or at least primarily dedicated to communicating with and/or controlling the geolocation and/or status monitoring devices; or the control device may be a general purpose communication device (e.g. a home or portable computing device, such as a smartphone, a tablet computer, a laptop computer, a mini-tablet device, or the like). The controlling device may be a single device or the user(s), e.g., parent and/or child, may switch between two or more controlling devices, such as where the parent or other monitor may track two or more geolocation devices, such as that of multiple children wearing the bracelets. In some instances, features and functions described elsewhere herein as part of a controlling device can be provided by one of a plurality of devices associated with multiple objects, e.g., children. Hence, in various embodiments, the geolocation and/or control devices disclosed herein can optionally include a processor and/or communications hardware that can permit the personal devices to communicate with one another, and in some embodiments to act as a controlling device.

Particularly, in some instances, a user, e.g., a parent, may require location data, or proximity information, and/or status data regarding his or her child or children. In many instances, the parent will want to know the child is at a particular location, or within a certain radius of the parent, e.g., the parent's controlling device that is synched or otherwise linked via one or more wireless communication protocols to the geolocation and/or monitoring device, e.g., bracelet, associated with the child, and/or to know the status of one or more conditions of the child. In certain of such instances, the controlling and/or geolocation device may, e.g., on a pre-determined schedule or intermittently, be programmed to expect a wireless communication signal from the other device, such as the geolocation and/or status monitoring device to the control device, or vice-versa, so as to allow the associated devices to communicate and/or track one another.

Consistent with the present disclosure, the controlling device and/or geolocation and/or status monitoring device may emit an alarm or warning if such a signal is present after a period of being absent, or absent after a period of being present. Additionally, the controlling device and/or geolocation and/or monitoring device may emit a signal, such as a visual or sound indication or vibratory warning when such a wireless communication signal from the geolocation and/or status monitoring device is detected, after a period of absence, or not detected, after a period of presence. The wireless communication signal may be arbitrarily received or may be received in response to a communication sent to the to or from the controlling device. The communications may use one or more communication protocols such as variants described in the IEEE 802 standard, or proprietary wireless communication techniques. For example, the controlling device and geolocation and/or monitoring device may use variants and/or combinations of wireless communications signals, such as Bluetooth®, ANT, Wi-Fi, cellular data (e.g., LTE), etc., as described above.

Further, as described above, in some instances, the controlling device may instead locate the geolocation and/or monitoring device using longer-distance wireless communication schemes, including cellular networks, such as by comparing absolute locations of the controlling device and the geolocation and/or monitoring device. For instance, absolute or near absolute location data may be obtained or derived by detecting and analyzing signals from a Global Navigation Satellite System (GNSS), such as the Global Positioning System (GPS). In some embodiments, signals from other known-location transmitters, for example cell phone signal towers, may be used in place of, or to augment GNSS signals.

In some instances, the controlling device may transmit to and/or receive location information from the geolocation/status monitoring device by use of wireless data networks, such as Wi-Fi, or cellular data networks, or wireless direct communications. Such wireless communications over a network may utilize dynamically assignable addresses such as one or more of those used in TCP/IP protocols, the controlling device may use IP and/or typically more-persistent and device-specific MAC addresses for direct controller-to-location/status device communication, or for network communication via a routing device. The signal strength of a radio signal communicated between the controlling device and the geolocation and/or status monitoring device may also be used to determine the distance between the bracelet and the controlling device.

Determining the geolocation of the geolocation and/or status monitoring device may be aided with the addition of a magnetic compass or magnetometer that detects changes in direction of the monitoring and/or monitored device, which components may be part of the controller and/or geolocation and/or status monitoring device, e.g., bracelet. Determining the location of the geolocation and/or status monitoring device may be accomplished using the device itself, which can house a power source, such as a battery, a communications module, and a circuit board with a processor, as described above. Alternatively, the geolocation device may transmit the location data to the controlling device, and the controlling device may analyze the location data to determine the location of the geolocation and/or status monitoring device, or vice versa. In other instances, the location data collected by the monitored device may be stored on the device, and then accessed at a later time for analysis to determine locations of the monitored device over time. The monitoring and/or status, and/or controlling device can determine and/or store the date and time and/or condition of the device when location data is collected.

The controlling or geolocation device may utilize a known location of the location, such as a location of geolocation and/or status monitoring device, compare this known location to its own known location, and issue a warning or emit an alarm when the location and status device is farther away from the controlling device than a predetermined threshold distance or is within a predetermined proximity of the controlling device, as described generally above. For instance, the location, control, and status device, such as a bracelet and/or mobile phone, may issue a warning or emit an alarm or other signal when the geolocation and/or control device is farther away from the other, e.g., geolocation device, than a predetermined threshold distance or is within a predetermined proximity of the other device, such as an electronic device such as a mobile computing device, tablet computer, or mobile phone. For example, a geolocation and/or status monitoring device, such as a bracelet, may be configured for lighting up when it approaches a user, e.g., parent, holding the controlling device, and/or vice versa, e.g., the control device, mobile phone, may be configured for lighting up, vibrating, sounding an alarm or otherwise signaling when the geolocation and/or status monitoring device approaches the control device, or vice versa. An alarm can include, but is not limited to, an audio alarm, a visual alarm, a vibratory alarm, a message sent to another device, or any combination thereof.

Besides being notified of the proximity or distance between the two devices, e.g., the controlling device and the geolocation device, a user may wish to actively track the movement of the device in real-time. For instance, the controlling device may have the ability to actively track the location of the location, control, and status device, such as on a map of the area surrounding a user or the area surrounding the geolocation and/or status monitoring device. For example, the controlling device may alternatively have the ability to actively track the location of the geolocation device such as by indicating the time and the distance between the user and the geolocation device and may chart the same such as on an electronic graph, table, or map. Such active tracking may be accomplished via a dedicated software application on the controlling device and/or tracking device, a software application running on remote server, or via a website.

In some embodiments, the geolocation and/or status monitoring device may communicate directly or indirectly with a server via a private or public network (e.g., the Internet). For example, a shopping mall, town, or city, or transportation hub, such as an airport or airline, may provide communication beacons or nodes or relays, as described herein, at strategic locations for collecting information about/from a geolocation and/or status monitoring device. The node/relay may detect the presence of the geolocation and/or status monitoring device and report such detection to a computer server and/or a control device. In some instances the node or relay may obtain information specifically identifying the location status monitoring device, along with its status. A location of the location and status monitoring device may be derived with respect to proximity of the node/relay, or may be reported from the location and status monitoring device to the node/relay. The identifying information may be recorded at the node/relay for future use, or may be forwarded to a computer server for any of several purposes.

For instance, location and/or status information obtained by such nodes/relays may permit statistical evaluation of locations and statuses of the wearer of the bracelet to aid the monitoring and/or control device to evaluate location and/or status history of the child or other wearer of the band. Such a system may be employed by homes, communities, towns and/or cities to monitor locations and/or statuses of the children living in those places. Moreover, specific obtained geolocation and/or status information may be presented on an access-controlled website for access by an enrolled parent or authorized monitor of the geolocation and/or status monitoring device. In certain instances, the provider of the network and/or owner of the information may require a user to subscribe to a service in order to access the information. This service may be offered for valuable consideration. All, or a part of collected geolocation and/or status information for one or more location and status monitoring devices may be made available, in various levels of specificity and/or aggregation for offering to various third parties.

In particular instances, to facilitate one or more of these implementations, a software and/or hardware application may be present and executed by one or more of the controlling and/or geolocation device and may provide a user interface that can display information from or about the location and/or status of the geolocation and/or status monitoring device(s) and/or the control device. The interface may further provide input portions that permit the user to enter information and/or commands. For instance, such a software application may be in the form of a "mobile app" for use on or execution by a mobile smartphone or dedicated device or processor thereof, or may be in the form of a software application for execution in a conventional personal computer (e.g., desktop or laptop or tablet) or enterprise computer system.

In various instances, the application's display features may include input mechanisms including mechanical or virtual: buttons, sliders, switches, text inputs, menu selections, and the like for entering data or changing settings. Accordingly, input mechanisms may include physical or virtual inputs such as keys, buttons, sliders, switches, etc. Moreover, the software application may utilize sensors provided in the controlling device itself and/or the geolocation and/or status monitoring device, including, but not limited to attitude, altitude, barometric and/or temperature sensors, accelerometers, gyroscopes, light sensors, user proximity sensors, microphones, speakers, etc. The display may present information textually and/or graphically. Graphics may include use of geographic maps, graphs, arrows, contour maps, level meters or charts, dials, gauges, and the like, or combinations thereof. Various modifications to the herein described may be employed for presenting a user with a view of data and/or means to interact with the software application for control of a location, control, and status monitoring device or data associated therewith.

For instance, an exemplary software application may present a user with a one or more menus or screens configured at least for permitting viewing and/or selection of user preferences or settings, for viewing data received from or related to one or more geolocation and/or status monitoring devices, and for controlling functions and/or determining the status of the location and/or status monitoring device(s). The application may include communication settings such as for pairing/bonding a geolocation and/or status monitoring device with a relay and/or controlling device (e.g., the device executing the software application). In addition to such control and presentation of wireless (or wired) "handshaking", communication features may include transmission of commands and settings, receipt of sensor data or historical data, alarm/warning notifications (e.g., at loss or attainment of proximity), etc.

In one example the communication features may permit a user to select among multiple available signals for use in calculating a location of a geolocation and/or status monitoring device. Additionally, the user, e.g., parent, may be presented with a list of typical use scenarios that correspond to a particular set of available signals. For example, the user might select from among "tracking" and/or "proximity" settings, where an particular setting selection may permit utilization of signals typical of that setting (e.g., various radar, cellular, and/or other signals). For instance, selecting a "child tracker" setting may utilize GPS and/or cellular signals more typically available for outdoor use, while selecting a "proximity" setting may use only a device-specific type of communication (e.g., Bluetooth® Smart). Such communication modalities may also be useful in determining the status of or otherwise controlling the tracking, geolocation, and/or status determining device.

For display settings a user may, in certain software and/or hardware application implementations, select from among color schemes, graph types, data types for display, analysis types for calculation and display, percentage vs. absolute amounts, etc. The application may present options for whether, and in what way, to display certain information. For example, the settings may permit overlap of certain data (e.g., location and proximity) for presentation in a single screen, or may permit selection of the type and number of screens that a user may scroll through, each screen presenting different data, or a different view of data.

Moreover, the communication features of the software and/or hardware application may permit a user to interact with a third-party server or website in order to view sensor data, comparative data (e.g., with other users, similar items, similar locations or destinations, etc.). Communications with a third party may include a subscription component permitting the user of the software application to initiate and maintain a subscription to third party services. That is, a party other than the software application user may provide subscription services for which the user may enroll. The communication features of the software application may directly or indirectly provide the user with a way to securely transmit personal and/or financial information for such subscription. The communication features of the software application may also permit a user, e.g., parent, to detect changes in the geolocation or status of the child wearing the bracelet in real-time. In some implementations, the software includes a feature that allows the user to select whether updates from a geolocation and status device are transmitted in real-time or on a scheduled or random basis.

The application may be used to manage features of a controlling device that utilizes a non-graphical information display, which may include various light emitting devices (e.g. LEDs), speakers, vibratory elements, and the like configured to provide appropriate information to a user. For instance, the software application may control use of dedicated arrows or meter-bars to indicate direction and/or proximity of the geolocation and status monitoring device. The application, e.g., software application, may manage operation of an audio component for producing sound in response to particular events. Such sounds and/or visual and/or vibratory notification signals may be generated and emitted from the controlling device and/or from the geolocation and/or status monitoring device. The application executed by the controlling device may cause the controlling or geolocation device to emit sounds/visual/vibratory notifications, or may transmit a command or other notification-causing data to the location and status monitoring device for emission of such notifications by the location, control, and/or status monitoring device. Hence, in some instances, the software application may cause transmission of a command to the geolocation and/or status monitoring device to emit a sound/visual/vibratory notification in which the sound/notification content is previously stored at the geolocation and status monitoring device, or vice versa. On the other hand, the software application may cause the controlling device to transmit sound/notification content data to the geolocation and status monitoring device such that the location and status monitoring device may emit the notification transmitted. In this way, the sound/visual/tactile notification for a particular geolocation and status monitoring device may be customized according to user preference or circumstance.

In particular embodiments, such as where the controlling and/or geolocation device includes a graphical display, the display may be integrated with a touch screen or may be distinct from user input mechanism. The graphical display may be controlled to present any combination of at least location, proximity/direction, status, maps, etc. Location may be presented at least as a description and/or as a map showing geographic location. The location may appear as a predetermined identifier on a map. For example, a graphical representation of the personal effect (e.g., child or children or other objects to be tracked) may appear on a map to help distinguish and identify the personal effect for visual confirmation of location. When multiple personal effects are monitored, each personal effect may appear separately in the graphical representation.

Proximity/direction may be presented by showing both the user and the proximate device (e.g., geolocation and/or status monitoring device) on a map, by providing a textual description, and/or a graphic representation of distance. For instance, the proximity may be presented as a distance (e.g., "20 ft"), as a level meter, and/or as a color-coded indicator (e.g., blue=near, red=distant). Direction may be indicated via a map, or by direction indicators (e.g., arrows) showing where the user may go to get closer to the location and status monitoring device(s). In embodiments having multiple location and status monitoring devices the proximity and direction indicators may include identifiers for each geolocation and status monitoring device. For example, an arrow tagged with a preset or user-selected identifier may point in the direction of a particular personal effect. The size, shape, and or color of the arrow may provide information regarding distance to the child. Multiple children may have corresponding identifiers.

The software application may include a "library" of objects, e.g., children to be tracked, from which a user may select to monitor the various location and/or status. For instance, a user may according to circumstance choose to monitor one or several children, such as during a particular trip. In another circumstance, the user may choose to monitor a geolocation and status monitoring device associated with a different item, person, or pet. This permits the user to monitor the location and status of the person or pet, etc. having a geolocation and/or status monitoring device to monitor the location and status of a geolocation and/or status monitoring device associated with a child. The user may, further have the option of concurrently displaying information for all or a subset of monitored geolocation and status monitoring devices. In yet other instances, the user may be able to query a specified number of monitored geolocation devices from the library and confirm that all selected devices are within a specified range of the controlling device or within a specified range of a geolocation and/or within a specified predetermined status, etc.

The software and/or hardware application may include a screen that presents location and/or status in a historical manner. For instance, the application may cause display of past and present locations over time, thus providing a route of the monitored geolocation and status monitoring device. Similarly, historical information may include status over time. For example, presenting the number of times that a child enters or leaves a particular location, such as a list or map of locations and/or times at which the same took place. In geolocation and/or status monitoring device implementations having an associated image capture device, a list or map showing historic travelings may selectably permit display of a photo or video captured during one or more of such openings. Moreover, historic data may include any combination of information collected over time. Thus, the historic data may include any combination of data collected over time, including at least location, proximity, altitude, pressure, battery level, etc. The historic data may be presented in any (or any combination) of graphs, charts, maps, color contours, lists, text descriptions, tactile presentations, vibrations, braille, audio descriptions or notifications, etc. Those having skill in the art will recognize that patterns and trends in data may be analyzed and presented for further consideration.

The software application may also include a feature that communicates with a processor of a geolocation and status monitoring device to update software or firmware stored in the location, control, and status monitoring device. For instance, the software application may update firmware periodically, or in response to a user command. Firmware updating may include obtaining, e.g., by download, an updated firmware version, determining a software/firmware version currently in a geolocation and/or status monitoring device, transmitting the update firmware if the firmware version is different from the obtained firmware version, and causing the location and status monitoring device to use the transmitted firmware version. The geolocation and/or status monitoring device may be updated wirelessly or may in some implementations be configured for wired connection. Such wired connection may also be used for download of data to a computer and/or for charging a battery of the location and status monitoring device.

The software application may also be configured to monitor a software repository for an update version of the software application. Upon detecting an update version, the software application may prompt a user to update the software. Alternatively, the software application may be configured to receive a notification of update version, the notification being pushed from a software repository when an update version is available. In some instances, the predetermined threshold distance between the geolocation and/or status monitoring device and the control device may be about 30 meters or less, about 2 meters or less, or even about 1 meter or less, such as about 20 meters or 10 meters, 5 meters, 3 meters, a foot or less. In other instances, the predetermined threshold distance can be about 10 meters or more or less. In still other implementations, the predetermined threshold distance can be about 50 or about 40 or about 30 or about 20 or about 15 meters or more or less. In some implementations, a user-configurable threshold distance can be set by the user through a user interface or other input device associated with or otherwise in communication with the controlling device.

As an example, a controlling device can include one or more of software-based (e.g. a touch screen, a voice activated control, a keyboard, a trackball, a mouse, a stylus, or the like) and/or hardware based (e.g. physical buttons or switches, etc.) controls that can allow variation of the user-configurable threshold distance. Such controls can allow a user to configure the user-configurable threshold distance directly in terms of a distance or indirectly in terms of some other criteria (e.g. by providing choices based on factors), which correlate to an actual threshold distance. In some instances, the threshold distance can be based upon the available communications technology (e.g., a functional range over which a reliable wireless communication link can be achieved between the controller and the personal effect), the importance of the personal effect to which the location and status monitoring device is attached, or the like.

In other instances, the threshold distance can be based in part on the environment around the personal effect, for example, a location of the child within a given area of a park, airport, or the like. In some instances, a triggering device at a particular location can trigger the bracelet on the child to cause transmission of a signal to notify a user of the child's presence or departure. Depending on implementation, the signal may be sent from a beacon, relay, or scanning device or from the bracelet directly to a user's controlling device or to an enrollee-accessible webpage that is configured for such purpose.

In some examples, a user may wish to know a precise geolocation of a child wearing a geolocation bracelet. Consistent with one or more implementations of the current subject matter, the controlling device may receive data from a corresponding location and status device indicating such location. In such cases, the geolocation and/or status monitoring device may employ location sensors, receivers, or transceivers. Such location sensors can optionally include one or more technologies such as a Global Navigation Satellite System receiver (GNSS). Exemplary GNSS systems that enable accurate geolocation can include the Global Positioning System (GPS) in the United States, Globalnaya navigatsionnaya sputnikovaya sistema (GLONASS) in Russia, Galileo in the European Union, and BeiDou System (BDS) in China.

Wireless signals from any signal emitter having a known location may be received and used for calculating location. Of particular use are signals that themselves include location information or a unique identifier that can be indexed to a known location. For instance, alternatively or in addition to navigation satellite information, location sensors consistent with this disclosure can include radio frequency (RF) and/or microwave power sensors, such as heat-based (thermistor or thermocouple power sensors) or diode detector sensors. RF and microwave power sensors can allow radio frequency triangulation with respect to known-location transmitters such as cellular communication relay locations (e.g. cell towers), or other devices with known positions. Such signals, for non-limiting example, maybe based on the Institute of Electrical and Electronics Engineers' (IEEE) 802.11 standards (WiFi), IrDA (Infrared Data Association), ZigBee® (communications based upon IEEE 802 standard for personal area networks), Z-wave, wireless USB, or the like, and may include an identifier such as a Media Access Control (MAC) and/or Internet Protocol (IP) address of the transmitting device, or other typically unique identifier.

Other exemplary RF and microwave signal sources that may be used be a geolocation/status monitoring device for determining location or proximity include those used for aviation, such as radar systems (e.g. high power radar or ground control radar for aviation), VHF omnidirectional radio range (VOR) stations, microwave landing systems (MLS), instrument landing systems (ILS), automatic dependent surveillance-broadcast (ADS-B), and ground control radios. RF signals from radio and television stations, as well as wireless utility meters for electricity, gas, and water can also be used. Depending on the type and strength of the RF or microwave signal that is detected, one or more antennas may be built into the bracelet. In some instances, the one or more antennas can be provided on the exterior of the bracelet or other object or just under the outer layer of the bracelet; in certain instances, the one or more antennas form a decorative design on the exterior.

For instance, a geolocation/status monitoring device may receive signals from two or more transmitting devices, where the signals include an identifier for the transmitter (e.g., Media Access Control (MAC) address), from which an absolute location of the transmitter can be determined by lookup. Analysis of the two or more signals can then be performed to calculate a location of the geolocation/status monitoring device. In some such examples, a location and status monitoring device may include a processing unit that coordinates determination of the location of the device, such as using RF fingerprinting of one or more RF signal generators. The processing unit may also facilitate synchronization between a geolocation and/or status monitoring device and a controlling device.

RF fingerprinting of radio frequency or microwave signals from an RF source can allow for more accurate triangulation by accurately identifying RF or microwave emitting sources having known locations by characteristics of those signals. In some implementations, multiple sensors for multiple types of RF or microwave signals can be used to identify and triangulate an accurate location. Geolocation can be correlated with an RF fingerprint of multiple RF or microwave sources, and known correlations of RF fingerprints and geolocations can be stored in a database. When RF or microwave signals from multiple sources are received by sensors on the bracelet, the RF fingerprint can be determined and compared with the database in order to determine the geolocation of the child.

RF signal analysis for proximity may include measurement of the received signal strength (or amplitude) of the radio signal. In some implementations, proximity of location and status monitoring device can be determined by reference to an object, such as another location and status monitoring device or a controlling device. For example, a Bluetooth® Smart signal from a location and status monitoring device may be analyzed to detect an approximate distance and direction from a controlling device. In another example, proximity may be obtained using Doppler principles. That is, a transceiver in the bracelet may send a radio signal from the bracelet to an object, e.g., a beacon or relay, having a known location. The radio signal is then reflected from the object back to the transceiver. The returning RF waveforms may be detected by matched-filtering, and delay in the return of the RF waveform is measured in order to determine distance from the object. In still another non-limiting implementation, a magnetic or electric field may be analyzed to detect disturbances in the field caused by movement of a relatively large dielectric object (such as a person or personal effect). Sensors can passively (and thus at low power) detect changes in spatial potential within the field and thus provide position, movement, and direction within the field.

Geolocation can also be determined by using inertial sensors (e.g. accelerometers and gyroscopes; see infra) either in addition to, or in place of GNSS, RF fingerprinting, or other location systems. If suitable RF or microwave signals are not available or have insufficient strength for detection, information from inertial sensors associated with the bracelet disclosed herein can be used to calculate relative location using dead reckoning with respect to a previous location, or absolute location with respect to a last-known absolute location. For instance, an inertial sensor data on the current angular velocity and the current linear acceleration of a child and/or his or her movements can be used to determine the angular velocity and inertial position of a bracelet having such sensors. In some implementations, inertial sensors may be combined with a compass associated with the bracelet to increase accuracy of direction calculations.

A user may wish to link or associate multiple geolocation and status monitoring devices (e.g., multiple persons) to the same controlling and/or monitoring device. A user may additionally wish to link or associate multiple geolocation and status monitoring devices to each other. In such scenarios, the user may designate one location and status monitoring device to be a dominant device that communicates to the controlling device, while the other location and status monitoring devices communicate to the dominant device. Such linkages may be unidirectional or bidirectional.

An example of this would be the use of a location and status monitoring device, such as a bracelet or mobile phone paired therewith, designated by a user to be the dominant device. Accordingly, in such an instance, the one or more geolocation devices may each include a digital logic circuit board arrangement that further includes a pairing device such as for pairing the geolocation device(s) with a remote master device such as via a wireless communication channel. In such an instance, the pairing may be defined by a distance between the geolocation device(s) and the master device such that if the distance between the geolocation device and the master device exceeds a predetermined range, an alarm is set off in one or more of the geolocation device and the master device. Particularly, where multiple geolocation devices are to be tracked, such as via a master controller, the user may have synchronized the dominant device, e.g., child's mobile phone, with the controlling device, e.g., parent's mobile phone. The bracelet(s) communicates its location and/or status information to the master device, e.g., phone, which in turn communicates this information along with its own location and status to the controlling device. Such an approach can allow use of lower power communication devices (e.g. Bluetooth® Low Energy [BLE, a.k.a. Bluetooth® Smart], ANT+, RFID, IrDA, Zigbee®, etc.) on the location and status monitoring devices other than the dominant device, which can optionally include a higher power communication device such as a cellular transceiver or WiFi transceiver for communication over longer distances. In this manner, the dominant device can communicate with the controller device over longer distances and can communicate with the other geolocation and status monitoring devices associated with a plurality of children. In some implementations, a wireless mesh network may be used to allow the monitoring devices to route data and signals efficiently to and from the controlling or dominant device.

Synchronization or association of the controlling device with a geolocation and status monitoring device or between two or more geolocation and status monitoring devices may include an exchange of electronic data. The exchange of electronic data may notify an associated device (e.g., controlling device) of a unique identifier for each of the other devices, or may provide a code shared in common by all of the associated devices. A controlling device or primary location and status monitoring device may use unique identifiers to individually communicate with any or all of several associated location and status monitoring devices, and may obtain device-distinguishable data from each associated geolocation and status monitoring device. On the other hand, when all devices share a common code for identification, the controlling device may treat a group of location and status monitoring devices as a single unit. In such implementations, a controlling device may learn of, e.g., proximity or location from any one of the associated geolocation and status monitoring devices. This may be useful and efficient in instances where all of the associated location and status monitoring devices are typically considered together, such as a group of children.

Implementations consistent with this disclosure may combine the use of unique identifiers and common codes in order to make use of the advantages of both schemes. A common code may alternatively be used to uniquely secure communications between the controlling device and geolocation and status monitoring device(s). For instance, the common code/password/key/token may be used as a part of an encryption scheme such as wireless access protocol (WAP), wired equivalent privacy (WEP), Wi-Fi Protected Access (WPA), variants thereof, or other standard or proprietary security protocols permitting secured communications. Such security protocols may implement cryptography algorithms such as advanced encryption standard (AES), data encryption standard (DES), RSA, and the like. In addition, communications may implement compression algorithms and/or hashing functions in order to reduce the amount of data transferred and to ensure data integrity. The encryption schemes may be implemented using dedicated circuitry and/or general purpose processors, and may further utilize processors, magnetic and/or solid state memory devices, electronic fobs, electronic dongles, SIM cards and the like, or any combination thereof.

Figure 2A:
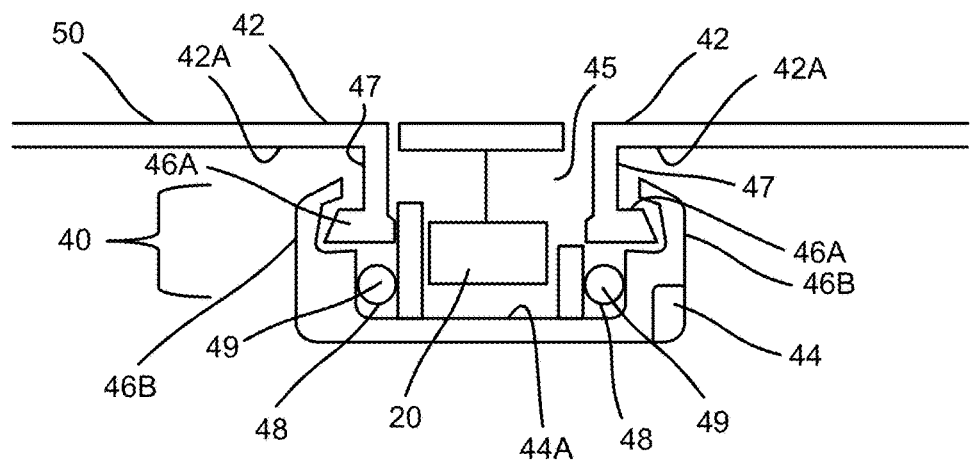
FIG. 2A is a cross-sectional view of an exemplary multi-part identity, geolocation, and/or health status monitoring apparatus of the disclosure, configured as a bracelet.
Figure 2B:
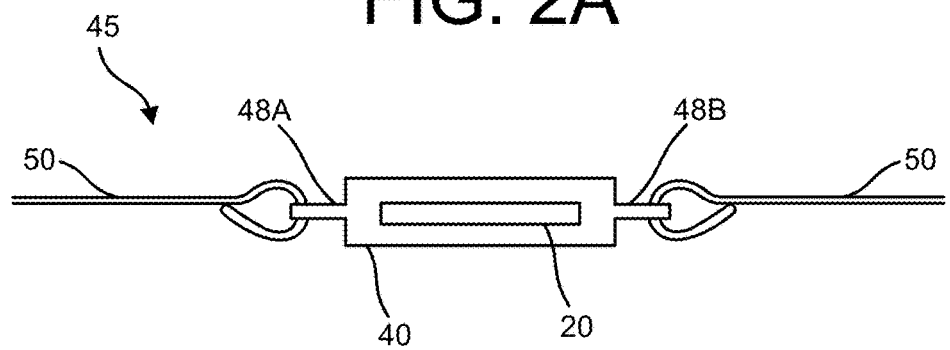
FIG. 2B is a side view of an exemplary identity, geolocation, and/or health status monitoring apparatus similar to FIG. 2A, but encased within a single material, configured as a multi-part bracelet.
Figure 2D:
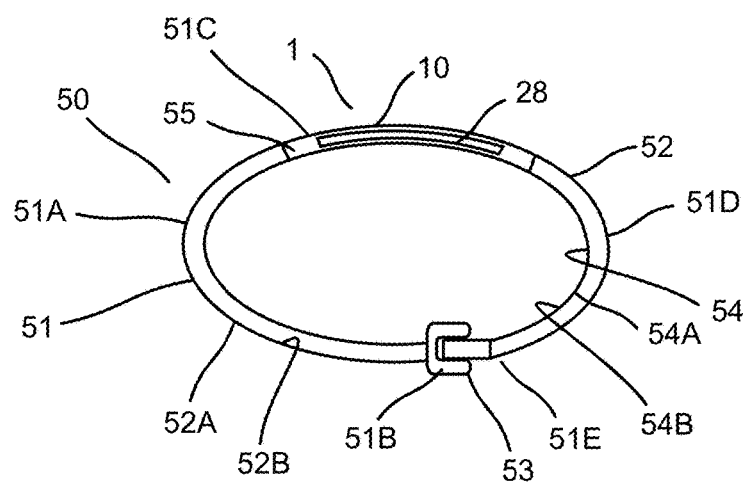
FIG. 2D is a side view of another exemplary identity, geolocation, and/or health status monitoring apparatus similar to FIG. 2B, but molded within a single material.
Figure 2C:
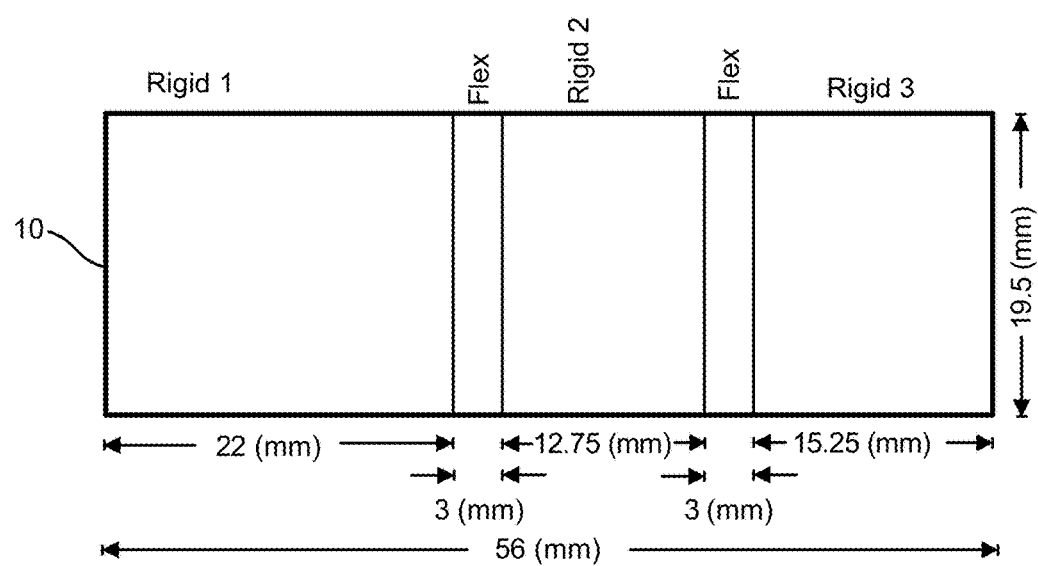
FIG. 2C is a top down view of an exemplary identity, geolocation, and/or health status monitoring apparatus, configured of as a bracelet.

As indicated above, and as can be seen with reference to FIGS. 2A-2C, in one aspect, the chip 20 provided herein may be configured to function as a thin profile geolocation device for locating a person, animal, and/or object within a geographical region that is easy to use and simple to manufacture. In various instances, the device may further be configured to function as an identity, position, and/or health monitoring apparatus. In various instances, the chip 20 has a thin profile, is lightweight, uses low energy, and may be curved, such as for ease of use, such as within the bounds of a curved piece of jewelry, such as a bracelet, for instance, a sports band.

Accordingly, with reference to FIG. 2A the identity, position, and/or health monitoring chip 20 may be contained within a housing 40 that may be coupled with or otherwise configured for being removably attached to a secondary article 50, such as a necklace, bracelet, ring, keychain, or the like that may be worn by the user of the device 1. Hence, in various instances, the identity, position, and/or health monitoring chip 20 may be included within a housing 40, which housing may include a single member having a first portion and a second portion that bends back on itself so as to encase the chip 20 between the first and second portions; or it may include a first member 42, e.g., a top member, and a second member 44, e.g., a bottom member, that when coupled together form the housing 40 within which the chip 20 may be encased. In various instances, the housing may include a hinge member, which hinge member functions to moveably align the first and second portions, or separate top and bottom members, together in such a manner that the housing may be opened or closed, such as for insertion of the chip 20 there between.

More particularly, the housing 40 may have a first portion or a first member 42, having a first (inner) surface 42A, and may further have a second portion or a second member 44, having a second (inner) surface 44A, such that when the first surface 42A is moved within closeable alignment with the second surface 44A, the first 42A and second 44A surfaces are separated from one another by a distance to form a chamber 45 there between, which chamber 45 is configured to securely retain the chip 20 therein. In various instances, the housing 40 is of one piece, such as a one piece elastic band, that has been manufactured in a manner such that the chamber 45 is formed between a first portion and a second portion of the elastic band 40, the chip 20 is inserted therein, and the insertion opening is closed thereby permanently coupling the chip 20 within the bounds of the band 40. In other instances, the housing 40 is a separate unit from a secondary article 50 to which the housing 40 may be removably coupled. In such an instance, the housing 40 may include retaining features 48A and 48B that function to allow the housing 40 to be coupled to the secondary article 45.

For instance, retaining features 48A and 48B may be any feature configured for allowing the housing 40 to be coupled, such as permanently or removably coupled to a secondary article 40. Particularly, where the secondary article is a necklace or bracelet, a single or multiple retaining features 48 may be included as part of the housing 40, where the retaining feature 48 may be one or more loops through which the necklace or bracelet 50 is threaded. In other embodiments, one or more of the retaining features 48 may be configured to be at least part of a buckle, a button, a zipper, a fastener, such as hook and loop fastener, a pin and loop fastener, a clip, or the like. In various instances, the retaining feature may be or otherwise include an adhesive.

In various instances, the housing 40 may be a waterproof housing. For instance, a portion or the entire PCB, RF antennas, chipset, including GPS and/or SIM, charging coil or antennas, and/or battery may be encased in a durable and/or waterproof material, such as by being molded, e.g., injection molded, therewith. Particularly, the PCB and internal componentry may be held in place by a small plastic wireframe piece while the case material may be molded around the entire assembly. In certain instances, the telephone chipset may be omitted, such as in favor of Bluetooth or other wireless, e.g., cellular, communications modules, because of it's added bulkiness. In various instances, the case material may be a Thermoplastic Elastomer (TPE), such as with a relatively low melting point, so as to prevent overheating the battery and electronics during assembly, while making the unit waterproof. In these and in other instances, the housing 40 may include a top portion or member 42, and a bottom portion or member 44 that when coupled together form a liquid proof, e.g., a waterproof, seal there between.

For example, as can be seen with respect to FIG. 2B, the housing 40, which may be attachable to or integrally a part of a secondary article, such as a bracelet or band 40, may include a clasping mechanism 46. The clasping mechanism 46 may include a first portion 46A, e.g., associated with the top portion of member 42 of the housing, and may further include a second portion 46B, e.g., associated with the bottom portion or member 44, together the clasping mechanism portions 46A and 46B correspond with one another such that when operably associated with one another function to couple the top 42 and bottom 44 members together. Any suitable clasping mechanism can be employed for this purpose, but in some embodiments, may be a lip and groove, a tooth and opening, a buckle, a clip, and the like.

As depicted in FIG. 2B, the bottom member 44 includes a channel 48. The channel includes an interior bounding member 48A and an exterior bounding member 48B, which bounding members form walls extending upwards, e.g., inwardly, from the second inner surface 44A of the bottom member 44, and which walls are separated one from the other by a distance that defines the width of the channel 48. The channel additionally includes a sealing member 49, such as a gasket, to seal the interior of the cavity from the exterior of the cavity. In this configuration, the top member 42 includes an impingement member or wall 47 that extends downwards, e.g., inwardly, away from the first inner surface 42A, and is configured for compressing against the gasket 49, thereby sealing the channel from the ingress of water, or other liquid, when the top member 42 is associated with the bottom member 44 and coupled together by the clasping mechanism 46. In this embodiment, the clasping mechanism 46A is associated with the impingement member 47, and its corresponding clasping member 46B is associated with the exterior bounding member 48B.

For example, the clasping or latching mechanism 46A is configured as a lip or tongue that at least partially or fully circumscribes the perimeter of the impingement member 47, and the clasping or latching mechanism 46B is configured as a groove that at least partially or fully circumscribes the perimeter of the bounding member 48, and is adapted to receive the lip 46A. In this manner, the impingement member and interior bounding members bound the chamber, and a circumferential seal may be established between the top 42 and bottom 44 members when they are coupled together, such by the lip 46A being received within the groove 46B. In other embodiments, the clasping mechanism need not be an internal clasping mechanism, but rather may be an exterior clasping mechanism such as a buckle or latch part of which is on the top member and the other part of which is on the bottom member. It is noted, that although various configurations have been set forth with respect to the above disclosure, these various configurations are not binding an can be interchanged among the various members and their component parts without departing from the scope of the disclosure. For instance, the impingement member 47 and the channel 48 may be positioned on the opposite, e.g., bottom and top, members. In a manner such as this, the circuit board 10, or chip 20, etc. may be positioned within the cavity 45 and be retained therein in a waterproof environment. Additionally, an adhesive may also be used to seal the top member 42 against the bottom member 44 to effectuate or at least participate in the effectuation of a strong sealing between the two members.

As can be seen with respect to FIG. 2C, in particular instances, the identity, position, and/or health monitoring apparatus 1 may include a circuit board 10 containing the above referenced micro-processing, GPS, SIM, and/or other functionality, which apparatus 1 may be configured so as to be worn by a user, such as a child whose location is to be monitored and/or tracked, and, thus, in various embodiments, the circuit board 10, or chip 20 containing the same, may be configured so as to be part of, or otherwise coupled with, a piece of adornment, such as a piece of jewelry, a piece of clothing, a key chain, collar, and the like. For instance, as seen in FIG. 2D, in various instances, the printed circuit board (PCB) may be made of a rigid, semi-rigid, semi-flexible, flexible material or a combination of the same. In certain instances, the PCB may be a combination of rigid 10a and flexible 10b materials, such as having three rigid sections separated by two flexible sections, so as to allow the micro-components to be securely mounted on the rigid sections, while allowing the flexible sections to flex so that the overall board may be able to bend, and/or otherwise twist, stretch, or to curve such as to bend and/or conform to the wrists of a wearer of the band, such as a small child.

In various embodiments, the rigid sections 10a may range from about 5 mm to about 50 mm, such as about 10 mm or 12.75 mm to about 40 mm, such as about 15 mm or 15.25 mm to about 35 mm, such as about 20 mm or 22 mm to about 30 mm, including about 25 mm in length, e.g., per section. Likewise, the flexible sections may be from about 1 mm to about 20 mm, such as about 2 mm to about 15 mm, such as about 3 mm to about 10 mm, such as about 5 mm to about 7 mm in length, e.g., per section. In certain instances, the width may range from such as about 10 mm or 12.75 mm to about 40 mm, such as about 15 mm or 15.25 mm to about 35 mm, such as about 19 or 19.5 or even 20 mm or 22 mm to about 30 mm, including about 25 mm in width. In particular instances, the entire length may be from about 25 mm to about 100 mm, such as 30 mm to about 90 mm, such as about 40 mm to about 80 mm, such as about 50 mm to about 70 mm, including about 55 or 56 mm to about 60 mm in length.

Particularly, the substrate 10 may be composed of one or more layers, such as conductive layers, e.g., of metal portions such as copper, that have been layered on top of an insulating layer, such as an insulating layer made of a glass epoxy. In various embodiments, the circuit board may include a top layer (GTL), such as a layer including the components and/or signal emitters of the device, a middle layer, such as a ground plane (G1) and/or a power/signal layer (G2), and/or a bottom layer (GBL) that may include one or more various system components, and the like. One or more of the layers may include a metal mask with one or more vias, such as a copper layer, e.g., about a half-ounce or 0.7 mls, and/or one of the layers may include a silkscreen or other non-conductive layer. In various instances, the entire PCB area may include a 2 layer flex PCB with rigid sections that may include an additional top and/or bottom layer that is rigid and/or which may be configured so as to contain the various components of the device, such as the electrical components. Hence, the rigid sections may include 4 layers, and in some instances, the signals between the rigid sections may be routed using one or more of the two or more flexible layers.

Further, as can be seen with respect to FIG. 2B, in various embodiments, the monitoring apparatus may be a part of a piece of jewelry, such as a necklace, a wrist bracelet, a ring (e.g., an ear, finger, belly, toe, ring and the like), an ankle bracelet, and the like. For example, as depicted in FIG. 2D, the identity, position, and/or health monitoring apparatus 1 is part of a bracelet 50. Particularly, in some embodiments, the monitoring apparatus may be a piece of adornment, such as bracelet 50. The bracelet 50 may include an identity, position, and/or health monitoring apparatus 1, as described above. The monitoring apparatus 1 may be a separate unit from the bracelet 1, which may be coupled with or otherwise attached to the bracelet 1, such as through an appropriately configured retaining element, or the monitoring apparatus 1 may be contained within the bounds of the bracelet 1. For instance, the bracelet 1 may include a first surface 52 and a second surface 54, which first and second surfaces are separated by a distance sufficient to allow the monitoring apparatus 1 to be retained there between. In various embodiments, the first or second surfaces may be the substrate upon which the electronic circuitry is printed. Particularly, the bracelet 50 may be composed of an elongated body member 51 having a proximal portion 51A and a distal portion 51D, which proximal and distal portions are separated one from the other by a medial portion 51C.

The bracelet 50 may be formed as a continuous loop and thus the proximal, medial, and distal portions may merge into one another, and thus definable only with reference to a secondary object, such as the identity, position, and/or health monitoring apparatus 1 that is associated with the bracelet 1. In other instances, the bracelet 50 may include a proximal end 51B and a distal end 51E, which proximal and distal ends may include corresponding clasping mechanisms 53 allowing both ends to be coupled to one another, such as around the wrist of a wearer of the bracelet 50. This clasping mechanism, along with all the other clasping mechanisms set forth herein may be any suitable clasping mechanism allowing the two separate portions to be joined together, so as to be capable of being joined, disjoined, and/or rejoined with one another. For example, the clasping mechanism may be a buckle, button, fastener, such as a hook and loop fastener, a pin and loop fastener, a tongue and groove fastener, a latch fastener, a clip, a tie, a screw with corresponding screw threads, a cam, and/or any other coupling mechanism sufficient for joining the proximal and distal ends together.

As indicated above, the bracelet 50 may form the housing 40 within which the monitoring device 1 is retained. Accordingly, the bracelet 50 may be configured so as to include a chamber 55 within which the monitoring device may be received. Particularly, the bracelet 50 may have a first surface 52 and a second surface 54, where the first surface 52 includes an exterior surface portion 52B and an interior surface portion 52A, and the second surface 54 includes an exterior surface portion 54B and an interior surface portion 54A. The interior surface portion 52A of the first surface 52 and the interior surface portion 54A of the second surface 54 may be separated from one another by a distance, which distance defines the expanse of the chamber 55 into which the monitoring device may be positioned. The monitoring device 1 may be inserted into the opening of the chamber 55 by various manners, such as by being comolded therewith.

As can be seen with respect to FIG. 2D, the bracelet 50 to which the monitoring device 1 is to be coupled is curved. Accordingly, in various embodiments, the printed circuit board 10 and/or the chip 20 that includes the monitoring functionality may also be curved. For instance, both the bracelet 50 and the substrate 7, e.g., the circuit board 10 or chip 20, may have a curve, such as a curve that corresponds to one another. Particularly, the bracelet 50 may have a curve that has an arc, such as an arc that ranges from 30 degrees to 360 degrees, and likewise the substrate 7 may also have a curve that has an arc, such as an arc that correspondingly ranges from 30 degrees to 360 degrees.

Additionally, in various embodiments, the identity, position, and/or health monitoring device 1 may be designed to have a thin profile. As such the bracelet, and/or the circuit board 10 containing the micro-processing function itself, may have an overall thickness that ranges from about 3 mm to about 8 mm, for instance from about 3.2 mm to about 7.8 mm, including about 3 mm to about 8 mm, and in some instances may be about 8 mm thick. In certain embodiments, the identity, position, and/or health monitoring apparatus 1 may include and/or may otherwise be coupled to an input/output module, one or more displays, and/or one or more sensors. In various instances, the circuit board may be a rigid or semi-flexible digital logic circuit board.

For instance, as can be seen with respect to FIG. 1A, the identity, position, and/or health monitoring apparatus 1 may include an input device that is operably coupled therewith. In such an instance, input, such as input from a user, or a person associated with the user, may be received in any form, including, but not limited to, acoustic, speech, or tactile input. Accordingly, a typical input device may include, but is not limited to, keyboards, touch screens or other touch-sensitive devices such as single or multi-point resistive or capacitive trackpads, voice recognition hardware and software, optical scanners, optical pointers, digital image capture devices and associated interpretation software, a Universal Serial Bus (USB) port, Secure Digital Input Output (SD/SDIO) port, flash drive port, lightning port, and the like. Additionally, the identity, position, and/or health monitoring apparatus 1 may include a display that is operably coupled therewith, which display may function as a typical output for the monitoring apparatus. A typical display may be any suitable display such as those that are similar to a smart phone or tablet computing retina display.

Figure 3:
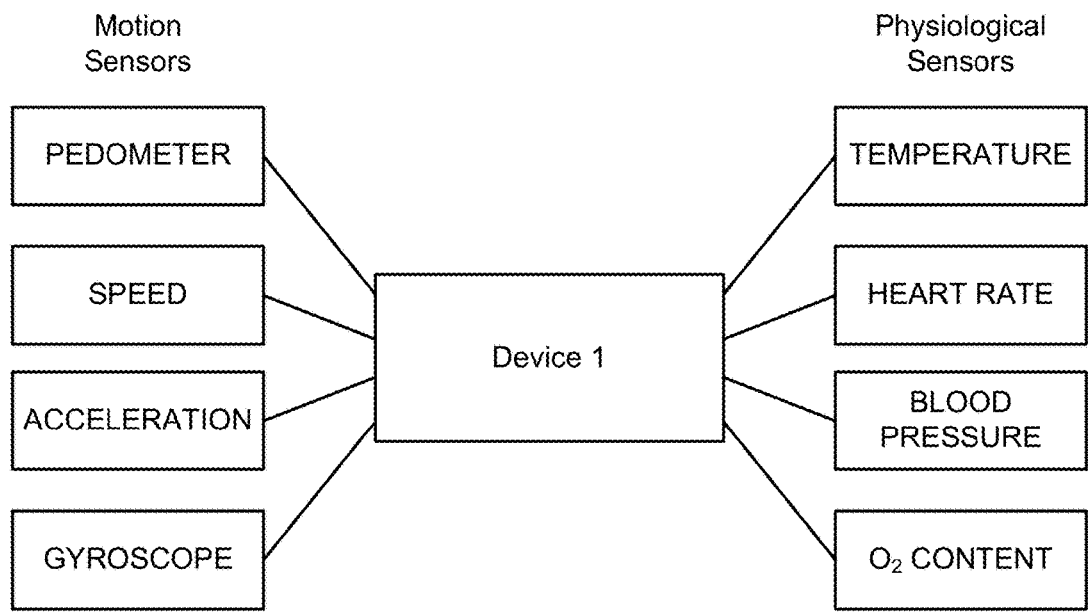
FIG. 3 is a diagram of various sensors that may be employed in conjunction with an exemplary identity, geolocation, and/or health status monitoring apparatus of the disclosure.

Additionally, as can be seen with respect to FIG. 3, in various instances, an identity, position, and/or health monitoring apparatus 1 of the present disclosure may include a sensing mechanism such as a sensor. A typical sensor may be any form of data collection mechanism capable of detecting a relevant characteristic, such as of a user or an environment of a user, and may be configured for transmitting that data to the microprocessor unit for processing and/or transmission and/or display such as to the user or an other third party, for instance, a parent, guardian, or medical personnel charged with taking care of the wearer of the circuit board.

For instance, in certain instances, the sensor may be a motion and/or orientation sensor, such as a distance measuring sensor, such as a pedometer, a speed or velocity measuring sensor, including an accelerometer, for example, a multi-axis accelerometer, a gyroscope, strain gauge, and/or a piezoelectric sensor, optical sensor, energy sensor, and the like. In various instances, the motion sensor may include sensors that detect instantaneous motion and/or sensors that detect velocity and the like for measurement of short duration movements or impulses. In further instances, the motion sensor may be one or more sensors that detect distance, speed, and/or velocity and the microprocessor, and/or the sensor hardware or software itself, may be configured to utilize that information about distances, passage of distance in relation to the passage of time, and/or the rate of such change so as to determine one or more other characteristics about motion, direction, and/or location. For example, information from such pedometers, distance, velocity, acceleration, orientation, and/or other inertial sensors associated with the monitoring apparatus can be used to calculate relative location, such as using dead reckoning with respect to a previous location, or absolute location with respect to a last-known absolute location. In such an instance, inertial sensor data on the current angular velocity and the current linear acceleration of an object may be used to determine the angular velocity and inertial position of a device having such sensors. In some implementations, inertial sensors may be combined with a compass associated with the device to increase accuracy of direction calculations.

Accordingly, the various sensors or data from such sensors may be used in combination to determine other relevant information. For example, examples of such sensor combinations can include a distance sensor, such as a pedometer, e.g., a calibrated pedometer, an altimeter, and/or a clock, or watch, a stopwatch, a timer, and/or a pendulum, from which data speed and/or acceleration may be determined. Impulse data may also be used in such a calculation, and hence, such sensor combinations could also include accelerometers, including multi-axis accelerometers, gyroscopes, and the like. Such accelerometers and/or gyroscopes may be MEMS-based, nano-scale based, piezoelectric, piezoresistive, and the like.

Other distance sensors can include a GPS receiver or other sensors that utilize wireless signals to determine position, relative location, and direction, such as cell phone tower signals, which used with a suitable device, and the like. Sensors that detect distance from a fixed object through electromagnetic detection, optical detection, sonic detection, and the like, may also be employed. Combining these position sensors with a time marking sensor, such as a clock or timer or stopwatch, or the like, can help a monitoring entity observe how movements of the user vary over a single movement or sequence of movements, or over a period of time such as over an event that may last days, weeks, or months. In certain instances, one or more internal or external sensors may be employed such as where the configuration of the sensors may be placed so as to indicate the position of a person, animal, or object, and possibly relative position of limbs or portions of the person's body, may be useful in determining and/or monitoring vectors related to the direction of movement. Hence, in various instances, various sensors may be internal to the device and/or worn, and/or external to the device and/or worn for the determination of location, position, orientation, motion, direction, as well as speed, acceleration, as will as ascent and decent and the rate of change in such motions and/or directions.

In various embodiments, one or more of the included internal or external sensors may be configured so as to be a physiological data collector that may be configured so as to collect physiological data, such as data associated with a person, e.g., child or adult, and/or his or her state of health and/or performance in an activity, such as an activity requiring mental or physical exertion. For example, the sensor may be a physiologic sensor, such as a temperature gauge or thermometer, so as to measure the temperature of the user and/or his environment; a heart monitor, so as to measure the heart rate of the user; a blood pressure monitor, to measure the users blood pressure; a blood glucose monitor, to measure blood glucose of the user; as well as one or more sensors for sensing and/or determining one or more of: ambient or body temperature; heart rate; activity (steps, elevation); bodily chemical composition, e.g., glucose, insulin, Hormone levels, etc.; air pressure; blood pressure; blood $O_2/CO_2$ level; humidity; magnetometer or form of compass; accelerometer; gyroscope; proximity; light level; carbon monoxide; smoke/particulates; Personal Lightning Detector (EMP); and the like.

Accordingly, in various embodiments, an identity, position, and/or health monitoring apparatus is provided wherein the device includes a CPU such as a micro-controller or microprocessor, such as a 32 bit Ultra-Low Power ARM Cortex or Intel Cortex. The microprocessor may include a memory or may be otherwise operably connected to a memory, such as various low power serial NAND flash ICs. Additionally, the microprocessor may include a communications module that includes a transmitter and or a receiver, and/or may be operably coupled to the same. In various embodiments, the microprocessor may include or may otherwise be coupled to one or more sensors, such as one or more sensors related to determining geo-location, relative motion and/or direction, as well as one or more characteristics of movement, such as speed, acceleration, and the like.

In such an instance, the microprocessor may be configured so as to be operably coupled with one or more sensors, receivers, and/or transmitters for the purpose of better determining and/or communication such data. For instance, as described in greater detail herein below, in various instances, the microprocessor may be coupled to a receiver and/or other sensor that is configured for receiving a GPS or cellular signal so as to determine a position, location, and/or motion, and may further be coupled to a transmitter for transmitting data related to a determined position, location, and/or motion, such as over a radio frequency, or a cellular network, to a third party for the monitoring of the same. For example, the microprocessor may be coupled to a radio transmitter configured for transmitting data, such as over an operating range from about 2.4 to about 2.485 GHz frequency. In certain particular embodiments, the transmitter may include one or more of WIFI, Bluetooth®, Low Energy/Smart (BLE), ANT+, RFID, IrDA, Zigbee®, and the like.

Figure 4:
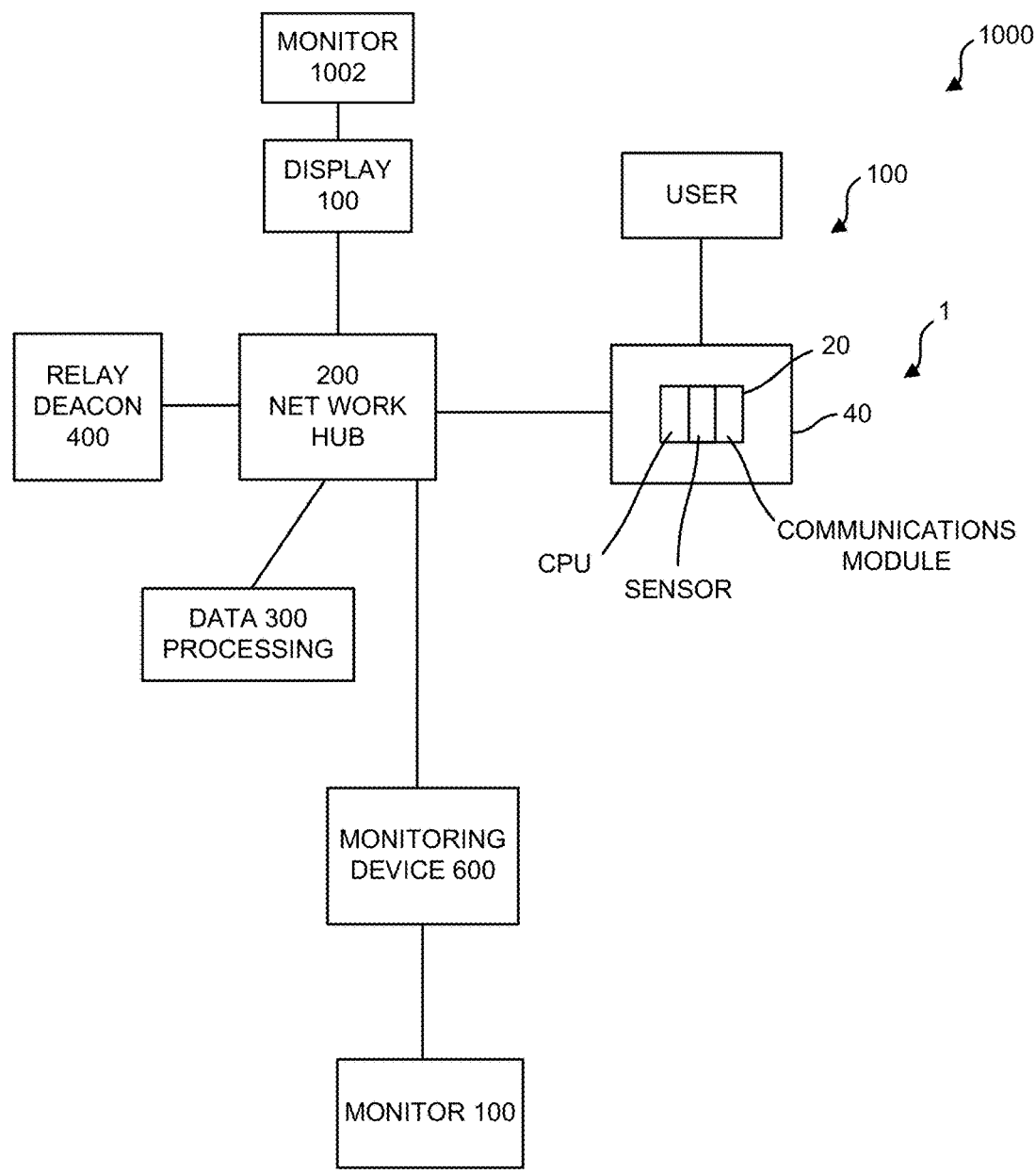
FIG. 4 is a diagram of an exemplary system employing the exemplary identity, geolocation, and/or health status monitoring apparatus of the disclosure.

As can be seen with respect to FIG. 4, in another aspect, a system for determining and/or displaying information about a user, his or her position and/or location, and/or a state of his or her condition of health is provided. In various implementations, the system 1000 may include one or more of an identity, position, and/or health monitoring apparatus 1, as described above, a user 100 of the system 1000, such as a person to carry or otherwise be coupled with the monitoring apparatus 1, and may include a network 200, a data processing unit 300, one or more external sensors 400, one or more external relays, or beacons 500, and/or one or more second or third party monitoring devices 600 such as a second or third party computing devices, such as a desk or laptop computing device, having a display, and/or a mobile computing device, such as a tablet, mini-tablet, of mobile cellular phone based or other handheld computing device.

Accordingly, in various embodiments, the system 1000 may include an identity, position, and/or health monitoring apparatus 1, such as that described above, which may include one or more of a microprocessor, a memory, a communications module, an input/output port, a battery, and/or one or more internal and/or external sensors. In such an instance, the monitoring device 1 may be contained within a housing, such as within the bounds of a bracelet, ring, keychain, or the like, as described above, which may be worn, such as by a child, adult, or other animal or object 100 the tracking of which may be desired, such as by a parent 1001 wanting to ensure the safety of the child 100. In particular, the device 1 may include a display mechanism and may be configured so as to function at least in part to display the identity of the user and/or a condition of the users health. As indicated, in various instances, the device 1 may contain a communications module that not only includes a receiver, such as a GPS receiver, such as for determining the location of the device and/or or a person, animal, or object associated with the device, but also may include a transmitter, such as for transmitting such position and other data over a network 200 to a suitably networked receiving device 600, such as a third party tracking and/or monitoring device, such as a computer.

Consequently, the system 1000 may be configured to track and/or monitor the user 100, such as a child, and/or the condition of the user and/or his environment, and communicating that information to a second party 1001, such as a parent of the child, or other third party 1002, such as a health care professional or government agency interested in monitoring and/or tracking the user. Hence, in such instances the monitoring device 1 of system may include a transmitting device configured for transmitting data about the user, his or her location, position, movement, and/or condition, and /or environment to a receiver, such as a computing device 600 that is suitably configured for receiving a transmission, for instance, a signal, such as a digital signal, from the transmitter of the monitoring device. Additionally, the system may include a network 200, such as a cellular, WIFI, or other network interface that is configured for effectuating the transfer of data from the transmitter of the monitoring device 1 to the receiver of the computing device 600. In various instances the system may include a data processing unit 300, for processing the data prior to or after transmission. Further, in some instances, the system may include a viewing system 700, such as a display screen, for instance, a liquid crystal display (LCD), light emitting diode (LED) display, plasma display, or the like.

Therefore, in action, the user 1001 of the identity, position, and/or health monitoring apparatus 1, whether it be a person such as an adult or child, or it be an animal, or an object, the tracking and/or monitoring of which is desired, is coupled with the monitoring apparatus 1. The monitoring apparatus 1 is synced over the network 200, e.g., via WIFI, BlueTooth®, or a cellular connection, to the monitoring device 600, which monitoring device may be a handheld electronic device, such as a mobile smart phone of a monitoring agent 1001, such as the spouse of the using adult or parent of the using child and/or the owner of the animal or object. Once synced the monitoring device 1 may play a subservient role to the monitoring device 600, which monitoring device 600 may play a master role.

As such, the relationship between the master device 600 and the subservient device 1 may be defined in many different ways. For instance, the master device 600 may set up a perimeter a given distance, e.g., X feet, away from the master device, such that if the servant device 1 approaches and/or exceeds that distance, an alarm can be set to go off warning the master device 600 that the servant device 1 is approaching the perimeter and/or has breached the same. The alarm can be an auditory, a tactile, e.g., vibratory, and/or a visual alarm that may increase in intensity and/or frequency as the distance of the servant device 1 away from the master device 600 increases. In a manner such as this a parent in control of the master device 600 may be warned when his or her child moves a given distance away from the parent. In such an instance, the master device 600 may be configured so as to periodically ping the servant device 1 in such a manner that the master device is capable of determining the distance between the two and/or whether that distance is increasing or decreasing and/or at what rate that increase or decrease is occurring.

This configuration may be useful so as to preserve the battery life of the device 1 in that it may remain in a sleep or quiet mode while within the boundary set up by the master device 600, thus only having to respond to queries sent by the master device. As indicated, communication between the master and servant device takes place over network 200, which network connection can be established directly between the devices, such as through a Infra-red or Bluetooth® or LE Bluetooth® connection, or indirectly such as over a WIFI or cellular connection.

In various instances, the system 1000 may include one or more relays 500A, such as one or more satellites, such as a global positioning satellite. For instance, in various implementations, once the perimeter has been breached, several actions may then take place. For example, an alarm cascade may be initiated at the subservient 1 and/or master device 600, the servant device 1 may be switched from passive mode to active mode, and relay and/or beacon tracking, such as through a suitably configured relay or beacon, such as a GPS satellite 500A may be initiated. In such a manner as this the servant device 1, and the person, object, or animal to which it is attached may be monitored tracked and/or monitored. Additionally, dependent on the type, number, and placement of the various sensors that may be associated with the device 1, internally and/or externally, the distance, speed, acceleration, direction, altitude, and orientation of the device 1, and/or device wearer, may be determined, tracked, and/or monitored. In further embodiments, one or more external sensors, such as beacons 500B, may be set up throughout a given zone, such as within a localized area, such as a school, a library, a mall, a given geographical region, such as a town, a city, and the like, which beacons 500B may be configured to connect to the servant device 1 over the network 200 so that the position and/or direction of travel of the device 1 may be determined, for example, in addition or substitution for said GPS tracking.

Any suitable device capable of sending out a signal to a secondary or tertiary device, receiving a signal back therefrom, and communicating that data, such as over network 200, to an additional device, e.g., a monitoring and/or tracking device, such as master device 600, may be used. More particularly, a beacon 500B may be a satellite, a cellular tower, a WIFI enabled device capable of sending out a request for identification signal, or other device that has specifically been designed to perform the function of monitoring such subservient devices 1 within a predefined region. For instance, such beacons 500B may be distributed throughout a given location or geographical region, and together they may function to generate a perimeter, or layers of perimeters, surrounding the designated location or geographical region. In such an instance, the beacons may be configured to electronically communicate with one another, and/or may be configured for communicating with one or more subservient 1 and/or master 600 devices within the perimeter, and/or one or more master devices within or without of the region, such as over network 200.

In various instances, the subservient device 1 and/or master monitoring device 600 may include a unique code, such as a radio frequency identification (RFID) code, identifying that device, such that any and all servant devices, master devices, relays, and/or beacons, and the like may be distinguished from one another. For instance, the transmitting signals can be coded in one or more ways so as to include a unique identifier of the signal generator. Such signals may include location information and may also include a unique identifier that can be indexed to a known location, such as for enhanced monitoring, tracking, and/or data collection. For example, navigation satellite information, e.g., such as from a relay 500, and/or location sensor information, such as from a beacon 500, may include radio frequency (RF) and/or microwave powered sensors, such as heat-based (thermistor or thermocouple power sensors) or diode detector sensors. RF and microwave power sensors can allow RF triangulation with respect to known-location transmitters, such as cellular communication relay locations (e.g., cell towers), or other beacon functioning devices with known positions. Such signals, for example, may be based on the Institute of Electrical and Electronics Engineers' (IEEE) 802.11 standards (WIFI), IrDA (Infrared Data Association), ZigBee® (communications based upon IEEE 802 standard for personal area networks), Z-wave, wireless USB, or the like, and may include an identifier such as a Media Access Control (MAC) and/or Internet Protocol (IP) address of the transmitting device, or other typically unique digital or analog identifier.

Other exemplary RF and microwave signal sources that may be used as a relay and/or a beacon and/or employed by the system for determining a location of the subservient device 1, such as for determining its location and/or proximity to said relay or beacon, or other known identifying feature or landmark, include RF signals, such as from radio and television stations, as well as wireless utility meters for electricity, gas, or water, which can also be used. For example, subservient device 1 may receive signals from two or more transmitting devices, where the signals include an identifier for the transmitter (e.g., Cellular Tower Identification Number, Media Access Control (MAC) address, and the like), from which an absolute location of the transmitter can be determined, such as by lookup. Analysis of the two or more signals can then be performed to calculate a location of the subservient device 1, such as by a data processing unit 300, as described below. Particularly, the subservient 1 and/or master monitoring device 600 may include or otherwise be coupled with a processing unit 200 that can be configured to coordinate the determination of the location of the device, such as using RF fingerprinting of one or more RF signal generators. The processing unit 200 may also facilitate synchronization between the subservient device 1 and the master monitoring device 600, as well as between subservient device 1 and a server or central hub 200.

Accordingly, in various embodiments, such RF signal analysis may be used for geolocation, and/or for determining the proximity of one or more subservient devices 1 to one or more fixed position relays or beacons 500, and/or determining the distance between other associated monitoring and/or tracking devices 1, 600. In various instances, such determinations may include the measurement of the received signal strength (or amplitude) of the radio signal. For instance, in some implementations, proximity of a device 1 and/or 600 may be determined by reference to a relay or a beacon 500, such as another location device, a master monitoring device 600 (such as mobile smartphone), or a fixed relay receiver or transceiver or beacon 500.

For example, a Bluetooth® Smart signal from the identity, position, and/or health monitoring apparatus of the disclosure may be analyzed to detect an approximate distance and direction from a master monitoring device 600 and/or relay and/or beacon 500. In another instance, proximity may be obtained using Doppler principles. In such an instance, a transceiver attached to the monitoring apparatus 1 may send a radio signal from the user to an object, such as a beacon, having a known location. The radio signal is then reflected from the beacon back to the transceiver. In various instances, the beacon, relay, or master device 600 containing a transceiver may send out a radio signal to the subservient device, and the location of the subservient device may be determined. In such instances, the returning RF waveforms may detected, e.g., by matched-filtering, and delay in the return of the RF waveform may be measured so as to determine the distance from the object, and thereby determine its location, such as by triangulation. In a manner such as this several associated or different subservient devices may be tracked and/or monitored at the same time and/or in the same location or geographical region.

Accordingly, once synced within a given perimeter set up by one or more relays, beacons, or other such devices of known location 500B, if the subservient device 1 leaves the perimeter a warning cascade, as described above may be initiated. In other instances, such relays and/or beacon(s) may be configured such that if a servant 1 device enters a proximity of the beacon and syncs there with it, the device 1 is identified, the direction, velocity, and/or other data, such as data related to travel, health or environmental, and other such data about the device 1 and/or the subject or object coupled to the device 1, may be determined, and/or communicating such as to a monitoring device 600.

Hence, in various instances, the system 1000 may include a data processing unit, which data processing unit 300 may function to receive data pertaining to one or more subservient devices 1, such as provided by one or more subservient devices 1 themselves, one or more relays or beacons 500, one or more master devices 600, and the like; process and compile that data; and then to transmit that transformed data to a receiving device, such as master device 600. In certain instances, the data processing system may be adapted to process the location, physical, physiological, and/or environmental data, e.g., generated by one or more of the subservient 1 and/or master devise 600, such as according to one or more first set of characteristic and/or characteristic generation programs, and determine a second set of compiled characteristics based on the one or more characteristic generation programs, which set of characteristics may represent one or more of a collection of processed data such as related to location, geographical, physical, physiological, and/or environmental data.

In such a manner, a plurality of subservient devices 1 may be tracked and the identity, condition, and/or location and/or position of the servant devices 1 may be determined and/or monitored. In various instances, the receiving device may be a master controller device configured to control the functioning of one or more of the beacons, relays, subservient devices, and/or the sub-master devices. Accordingly, in certain instances, synchronization between one or more of the devise of the system 1000 may be desired. In such an instance, synchronization or association between the one or more devices of the system may include an exchange of electronic data. The exchange of electronic data may notify one or more of the associated device (e.g., the master monitoring device 600 such as a smartphone) of a unique identifier, e.g. RFID, for each of the other devices, or may provide a code shared in common by all of the associated devices. Such devices may use unique identifiers to individually communicate with any or all of several associated devices of the system, including various relays 500A, beacons 500B, and/or other subservient 1 and/or monitoring devices 600, and may obtain device-distinguishable data from each associated device. In various instances, all of a group of devices may share a common code for identification, such as all the subservient or master devise within a given system, in such an instance, a master controlling device may treat the group of devices sharing a common identifier as a single unit. In such implementations, a controlling device may learn of proximity or location from any one of the associated subservient devices. This may be useful and efficient in instances where all of the associated devices are typically considered together, such as when belonging to members of the same family that move together.

In various instances, a common code/password/key/token, etc. may be used as a part of an encryption scheme, such as wireless access protocol (WAP), wired equivalent privacy (WEP), WIFI Protected Access (WPA), variants thereof, and/or other standard or proprietary security protocols permitting secured communications. Such security protocols may implement cryptography algorithms such as advanced encryption standard (AES), data encryption standard (DES), RSA, and the like. In addition, communications may implement compression algorithms and/or hashing functions in order to reduce the amount of data transferred and to ensure data integrity. The encryption schemes may be implemented using dedicated circuitry and/or general purpose processors, as described herein, and may further utilize processors, magnetic and/or solid state memory devices, electronic fobs, electronic dongles, SIM cards and the like, or any combination thereof.

As indicated above, in certain instances, the system may be configured for transmitting and/or displaying the various data collected, processed, and/or compiled, as discussed herein, using the techniques described herein. Particularly, the system disclosed herein may make use of one or more of a geolocation device, such as that described above, a network, a data processing unit, one or more external sensors, e.g., a beacon or relay, and/or a receiver, such as a computing device, e.g., a mobile computing device, to collect and compute various data. In various instances, such data may be transmitted and/or displayed to a second and/or third party, such as a second or third party interested in identifying, monitoring, and/or tracking the user and/or the user's activities and/or health. For instance, it may be useful to display such information to one or more users of the system, and hence in various instances, the system 1000 may include a display 700, such as a display configurable for displaying a picture or other graphical representation of the set of data characteristics measured. For example, in some embodiments, the set of characteristics may be adapted to represent one or more of the physical location, state, manner of movement, and/or a physiological condition of one or more users 100 of one or more monitoring devices 1. Such data may be stored, such as in a memory of one of the monitoring and/or tracking devices, and/or may be transmitted to one or more other devices. If displayed, the data may be displayed using any suitable device, such as a display of a desktop or mobile computing device, such as a liquid crystal display (LCD) or a Light Emitting Diode (LED) or the like. The resulting displayed material may be presented in a variety of ways including quantitatively, qualitatively, comparatively, in the form of a chart, in the form of a table, and/or in the form of a graph or other graphic.

In another aspect, a method for monitoring and/or tracking a person or an object is provided. The method may include one or more of providing a geolocating device, such as that set forth above, attaching the geolocating device to a person or an object to be monitored and/or tracked, and employing a receiver to monitor and/or track the person or object, such as over a network joining the two. More particularly, the method may include providing the geolocating device and employing the system described above to monitor and/or track the person or object. In various instances, the system may include a relay, such as a beacon, that is configured to receive a signal from the geolocating device so as to thereby determine the location of the device, and further transferring that information, such as via the network, to the receiver so as to thereby allow a third party to monitor the position and other data collected by the device.

Yet another aspect of the instant technology is a method for determining a set of characteristics of a user of the identity, position, and/or health monitoring apparatus of the disclosure. The method includes steps of: receiving directional, movement, and/or physical data associated with the user, the directional, movement, and/or physical data being collected by at least one sensor or other data collector associated with the user and/or his or her environment; receiving the directional, movement, and physiological data associated with the user and/or his activity, the data being collected by at least one sensor or data collector associated with the user and/or his or her environment; processing the data according to one or more characteristic generation programs; and determining the set of characteristics based on the one or more characteristic generation programs. In various instances, the method may include transmitting the data over a communications network to one or more devices associated with the network. In certain embodiments, the method further includes transmitting the set of characteristics to a data processing system over a wireless communication network.

Some or all of the steps and operations associated with the techniques or methods introduced here may be performed by hardware components or may be embodied in non-transitory machine-executable instructions that cause one or more general purpose or special purpose computer processors programmed with the instructions to perform the steps. The machine-executable instructions may be stored on a computer-readable or machine-readable medium. The steps may be performed by a combination of hardware, software, and/or firmware. In some cases the machine-executable instructions may be downloaded from a server, from a website, and/or from an application store or an app store. For instance, the device, e.g., bracelet, firmware may be upgradeable, such as using a BLE connection to a computer, smartphone, or other network enabled device. In such an instance, the computer, smart phone, bracelet, or other network enabled device may communicate through a suitably configured app, such as a smart phone app for directing the operations of the bracelet.

While this disclosure contains many specifics, these should not be construed as limitations on the scope of an invention that is claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Although embodiments of various methods, apparatuses, devices, and systems are described herein in detail with reference to certain versions, it should be appreciated that other versions, methods of use, embodiments, and combinations thereof are also possible. Therefore the spirit and scope of the appended claims should not be limited to the description of the embodiments contained herein.

The phrases "in some embodiments," "according to some embodiments," "in the embodiments shown," "in other embodiments," "in some examples," "in some cases," "in some situations," "in some configurations," "in another configuration," and the like, generally mean that the particular feature, structure, or characteristic following the phrase is included in at least one embodiment of the present invention and/or may be included in more than one embodiment of the present embodiments. In addition, such phrases do not necessarily refer to the same embodiments or different embodiments.

The term "about" is used herein to refer to +/−10% of a given measurement, range, or dimension unless otherwise indicated.

The invention claimed is:

1. A geolocation device adapted for low-profile wearing about a limb of a human, for locating the human within a geographical region, the geolocation device comprising:
an elastomeric housing that is sized and adapted for being worn about the limb of the human, the elastomeric housing having a circumferential portion that bounds a first surface and a second surface spaced apart from the first surface to form a waterproof cavity bounded by the circumferential portion, the elastomeric housing having a thickness of 3 mm to 10 mm so as to have a low profile when worn about the limb of the human;
an elongated substrate that is sized and adapted for being positioned in the cavity of the elastomeric housing, the elongated substrate forming a semi-flexible digital logic circuit board arrangement that comprises at least one rigid circuit board portion; and
a digital logic circuit connected with the semi-flexible digital logic circuit board arrangement, the digital logic circuit comprising a battery module, a memory, a central processing unit (CPU), a SIM card, a geolocation receiver comprising a GPS, and a communications module receiver, each of the CPU, the geolocation receiver, and the communications module being mounted to at least one rigid circuit board portion, the communications module comprising a radio frequency (RF) transmitter, a cellular transmitter, a WIFI transmitter, and a Bluetooth transmitter, the CPU being configured to receive geolocation data from the geolocation receiver and, based on the geolocation data relative to the geographic region, to select one of the RF transmitter, cellular transmitter, WIFI transmitter, and Bluetooth transmitter to transmit a signal.

2. The geolocation device according to claim 1, wherein the battery module comprises a battery configured for being wirelessly charged.

3. The geolocation device according to claim 1, further comprising one or more sensors.

4. The geolocation device according to claim 3, wherein the one or more sensors comprises at least one of a motion sensor, an orientation sensor, a distance measuring sensor, a pedometer, a velocity sensor, an accelerometer, a multi-axis accelerometer, a gyroscope, a strain gauge, a piezoelectric sensor, an optical sensor, and an energy sensor.

5. A wearable thin profile geolocation device for locating a human within a geographical region, the geolocation device comprising:
a substrate having an elongated body defined by a circumferential portion, the circumferential portion bounding a first surface and a second surface of the elongated body, the first surface being opposite of and separated from the second surface by not more than about 20 mm and forming a cavity therewith, the elongated body being sized and configured to be worn around a limb of a human; and
a semi-flexible digital logic circuit board arrangement contained within the cavity of the elongated body of the substrate and being positioned between the first and second surfaces of the elongated body of the substrate, the semi-flexible digital logic circuit board arrangement including a central processing unit (CPU), a communications module comprising a GPS receiver, a memory, and a battery, the CPU being operably connected to both the memory and the battery,
the semi-flexible digital logic circuit board arrangement further including a pairing device for pairing the geolocation device with a remote master device via a wireless communication channel, the pairing being defined by a distance between the geolocation device and the master device such that if the distance between the geolocation device and the master device exceeds a predetermined range, an alarm is set off in one or more of the geolocation device and the master device.

6. The geolocation device according to claim 5, further comprising one or more sensors.

7. The geolocation device according to claim 6, wherein the one or more sensors comprises at least one of a motion sensor, an orientation sensor, a distance measuring sensor, a pedometer, a velocity sensor, an accelerometer, a multi-axis accelerometer, a gyroscope, a strain gauge, a piezoelectric sensor, an optical sensor, and an energy sensor.

8. The geolocation device according to claim 6, wherein the one or more sensors comprises at least one physiological data collector.

9. The geolocation device according to claim 8, wherein the at least one physiological data collector comprises a heart rate monitor, pulse meter, a blood pressure monitor, a blood glucose monitor, a myoelectric sensor, a carbon dioxide sensor, a pulse oximeter, an oxygen saturation monitor, a hemoglobin sensor, an electrocardiogram monitor, an electroencephalography monitor, and a pressure monitor.

10. A geolocation device adapted for low-profile wearing about a human, for locating the human within a geographical region, the geolocation device comprising:
an elastomeric housing that is sized and adapted for being worn about the limb of the human, the elastomeric housing having a circumferential portion that bounds a first surface and a second surface spaced apart from the first surface to form a cavity bounded by the circumferential portion, the first surface and the second surface, the elastomeric housing having a thickness of about 3 mm to about 15 mm so as to have a low profile when worn about the limb of the human;
an elongated substrate that is sized and adapted for being positioned in the cavity of the elastomeric housing, the elongated substrate forming one or more of a rigid, semi-rigid, and a semi-flexible digital logic circuit board arrangement;
a digital logic circuit connected with the digital logic circuit board arrangement, the digital logic circuit comprising a battery, a memory, a central processing unit (CPU), a SIM card, a geolocation receiver, and a communications module comprising a GPS receiver, at least each of the CPU, the geolocation receiver, and the communications module being mounted to at least one portion of the circuit board arrangement, the communications module comprising one or more of a radio frequency (RF) transmitter, a cellular transmitter, a WIFI transmitter, a Bluetooth transmitter, and a low energy Bluetooth transmitter, the CPU being configured to receive geolocation data from the geolocation receiver and, based on the geolocation data relative to the geographic region, to select one or more of a RF transmitter, cellular transmitter, WIFI transmitter, Bluetooth transmitter, and a low energy Bluetooth transmitter to transmit a signal.

11. The geolocation device according to claim 10, wherein the elastomeric housing is formed as a bracelet.

12. The geolocation device according to claim 10, wherein the elastomeric housing is formed as a piece of jewelry.

13. The geolocation device according to claim 10, wherein the battery module comprises a battery configured for being wirelessly charged.

14. The geolocation device according to claim 10, further comprising one or more sensors.

15. The geolocation device according to claim 10, wherein the one or more sensors comprises at least one of a motion sensor, an orientation sensor, a distance measuring sensor, a pedometer, a velocity sensor, an accelerometer, a multi-axis accelerometer, a gyroscope, a strain gauge, a piezoelectric sensor, an optical sensor, and an energy sensor.

16. A wearable thin profile geolocation device for locating a human within a geographical region, the geolocation device comprising:
 a substrate having an elongated body defined by a circumferential portion, the circumferential portion bounding a first surface and a second surface of the elongated body, the first surface being opposite of and separated from the second surface by not more than about 15 mm and forming a cavity therewith, the elongated body being sized and configured to be worn around a limb of a human; and
 a semi-flexible digital logic circuit board arrangement contained within the cavity of the elongated body of the substrate and being positioned between the first and second surfaces of the elongated body of the substrate, the semi-flexible digital logic circuit board arrangement including a central processing unit (CPU), a communications module comprising a geolocation receiver, a memory, and a battery, the CPU being operably connected to both the memory and the battery,
 the semi-flexible digital logic circuit board arrangement further including a pairing device for pairing the geolocation device with a remote master device via a wireless communication channel, the pairing being defined by a distance between the geolocation device and the master device such that if the distance between the geolocation device and the master device exceeds a predetermined range, an alarm is set off in one or more of the geolocation device and the master device.

17. The geolocation device according to claim 16, wherein the elastomeric housing is formed as a bracelet.

18. The geolocation device according to claim 16, wherein the battery module comprises a battery configured for being wirelessly charged.

19. The geolocation device according to claim 16, further comprising one or more sensors.

20. The geolocation device according to claim 19, wherein the one or more sensors comprises at least one of a motion sensor, an orientation sensor, a distance measuring sensor, a pedometer, a velocity sensor, an accelerometer, a multi-axis accelerometer, a gyroscope, a strain gauge, a piezoelectric sensor, an optical sensor, and an energy sensor.

* * * * *